United States Patent
Park et al.

(10) Patent No.: US 10,749,468 B1
(45) Date of Patent: Aug. 18, 2020

(54) LAYOUT FOR VOLTAGE-CONTROLLED OSCILLATOR (VCO)

(71) Applicant: QUALCOMM Incorporated, San Diego, CA (US)

(72) Inventors: Ji-Hoon Park, Sunnyvale, CA (US); Yido Koo, Belmont, CA (US); Jeongsik Yang, San Jose, CA (US); Wei-Han Cho, Milpitas, CA (US); Xiaoyu Wang, Santa Clara, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 16/418,709

(22) Filed: May 21, 2019

(51) Int. Cl.
*H03B 5/12* (2006.01)
*H03L 7/099* (2006.01)
*H03L 7/093* (2006.01)
*H01L 27/02* (2006.01)

(52) U.S. Cl.
CPC ....... *H03B 5/1212* (2013.01); *H01L 27/0207* (2013.01); *H03L 7/093* (2013.01); *H03L 7/099* (2013.01); *H03B 2200/004* (2013.01); *H03B 2200/005* (2013.01); *H03B 2200/009* (2013.01); *H03B 2201/025* (2013.01); *H03B 2201/0208* (2013.01)

(58) Field of Classification Search
CPC .................................................. H03B 5/1212
USPC ............................................................ 331/2
See application file for complete search history.

(56) References Cited

U.S. PATENT DOCUMENTS

| 2006/0220737 A1* | 10/2006 | Sanderson | H01F 17/0006 330/69 |
| 2015/0295535 A1* | 10/2015 | Shi | H03B 5/02 331/67 |
| 2016/0036382 A1* | 2/2016 | Chakraborty | H03B 5/1215 331/117 R |
| 2018/0351528 A1* | 12/2018 | Liu | H03B 5/1203 |

OTHER PUBLICATIONS

Mellouli D., et al., "Design and Implementation of a 6-GHz Array of Four Differential VCOs Coupled Through a Resistive Network," Analog Integrated Circuits and Signal Processing, Springer Verlag (Germany), Aug. 2013, vol. 76 (2), 22 pages.
Marco Garampazzi, et al., "Analysis and Design of a 195.6 dBc/Hz Peak FoM P-N Class-B Oscillator With Transformer-Based Tail Filtering," IEEE Journal of Solid-State Circuits, vol. 50, No. 7, Jul. 2015, 12 pages.
Emad Hegazi, et al., "A Filtering Technique to Lower LC Oscillator Phase Noise," IEEE Journal of Solid-State circuits, vol. 36, No. 12, Dec. 2001, 10 pages.

* cited by examiner

Primary Examiner — Joseph Chang
(74) Attorney, Agent, or Firm — Loza & Loza, LLP/Qualcomm

(57) ABSTRACT

Certain aspects relate to a semiconductor die. The semiconductor die includes a voltage-controlled oscillator (VCO), wherein the VCO includes a resonant capacitor, and a resonant inductor coupled in parallel with the resonant capacitor. The resonant inductor includes a first elongated portion and a second elongated portion that are parallel with each other. The semiconductor die also includes a voltage supply line configured to route a supply voltage to the VCO, wherein the voltage supply line includes a first portion that runs parallel with the first and second elongated portions of the resonant inductor and is located between the first and second elongated portions of the resonant inductor.

31 Claims, 24 Drawing Sheets

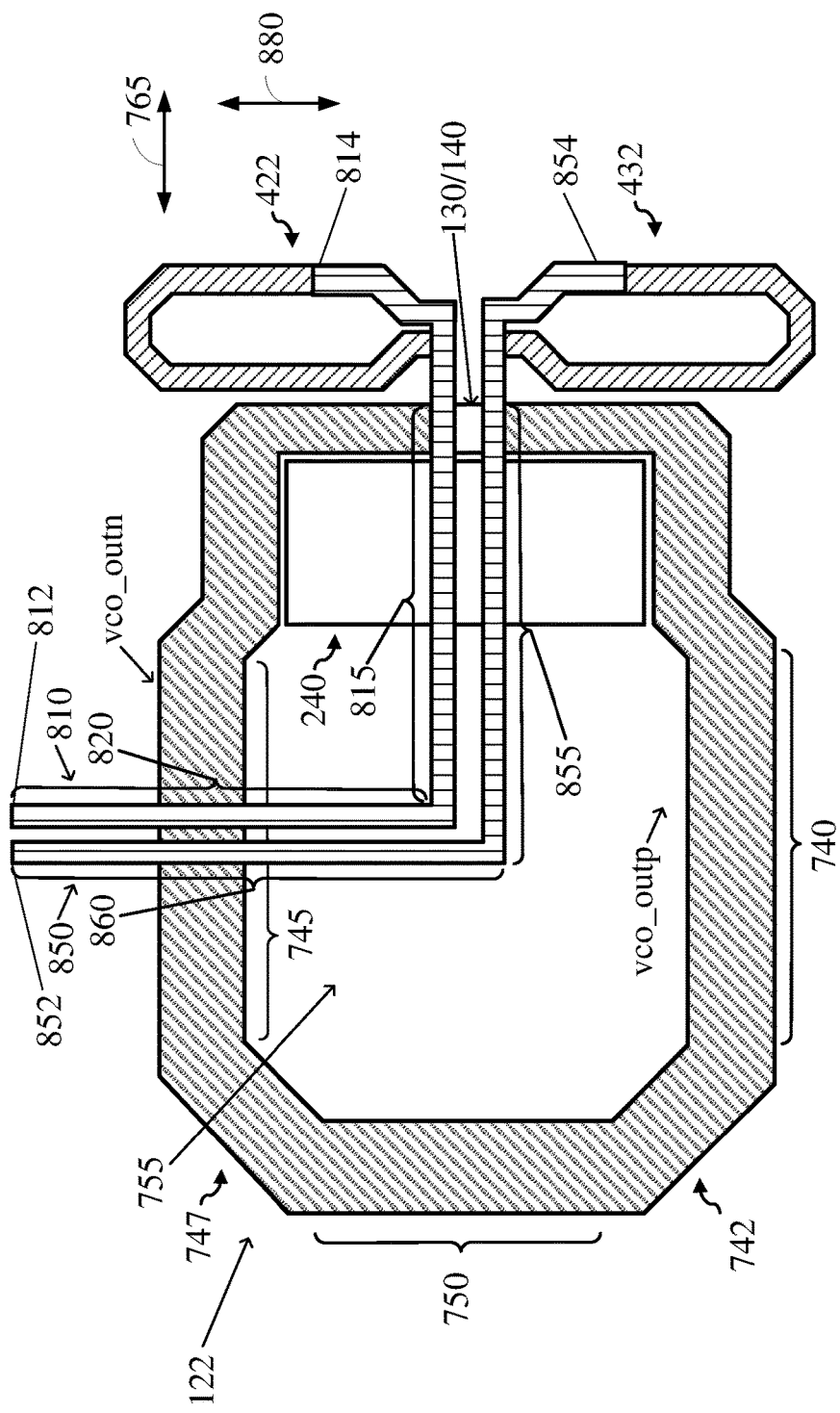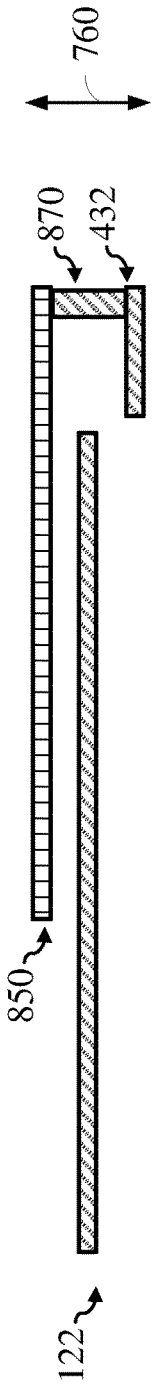
FIG. 8A
FIG. 8B

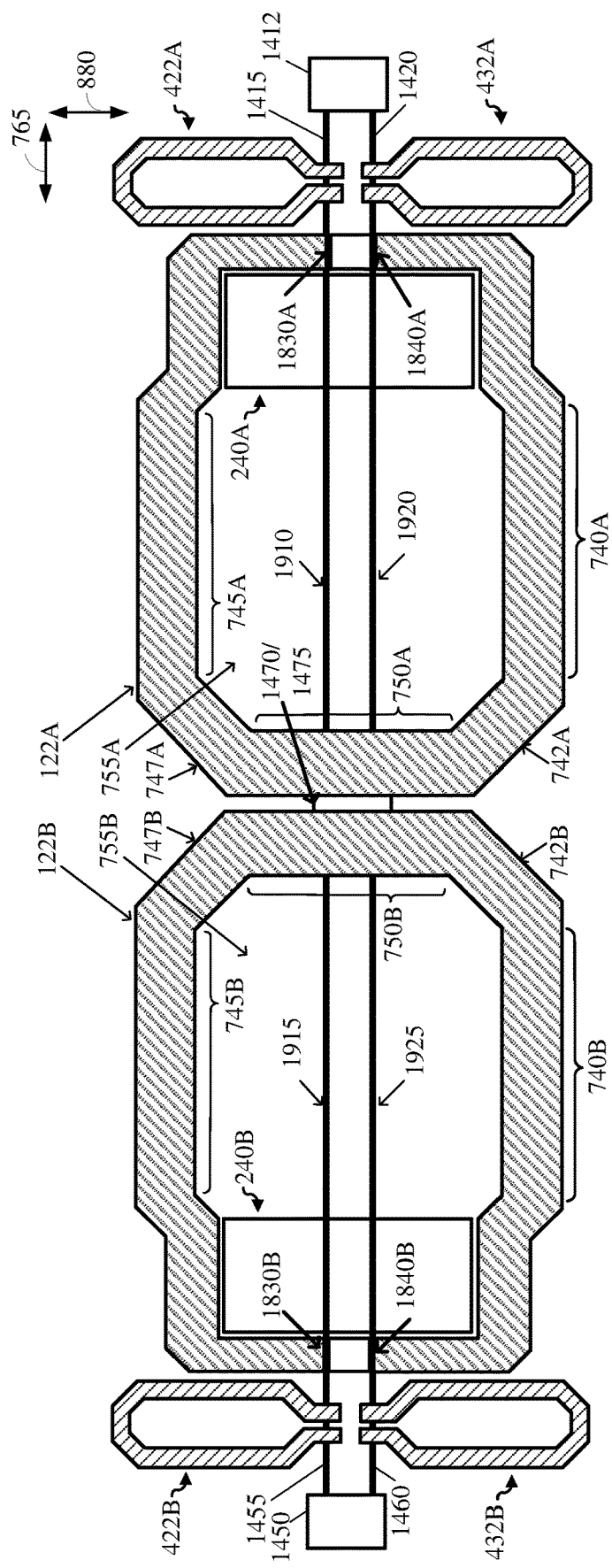
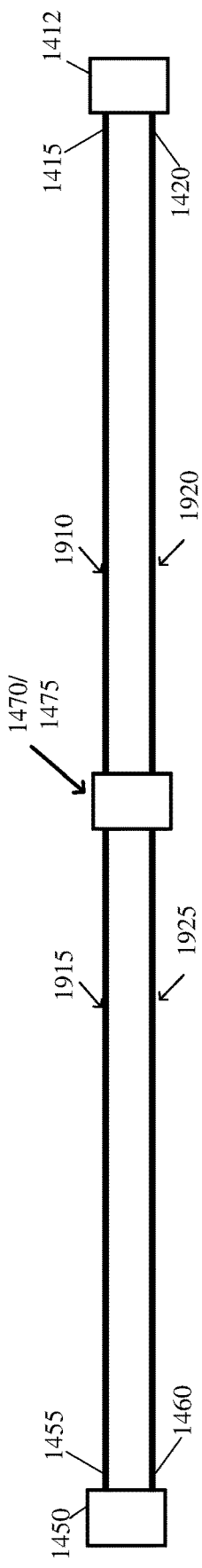
FIG. 19A
FIG. 19B

US 10,749,468 B1

LAYOUT FOR VOLTAGE-CONTROLLED OSCILLATOR (VCO)

BACKGROUND

Field

Aspects of the present disclosure relate generally to voltage-controlled oscillators (VCOs), and more particularly, to a layout for a VCO that reduces phase noise.

Background

A voltage-controlled oscillator (VCO) is an oscillator having an oscillation frequency that is controlled by a voltage input. A VCO may be used in a wireless device to generate an oscillating signal for frequency translation and/or channel selection.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

Certain aspects relate to a semiconductor die. The semiconductor die includes a voltage-controlled oscillator (VCO), wherein the VCO includes a resonant capacitor, and a resonant inductor coupled in parallel with the resonant capacitor. The resonant inductor includes a first elongated portion and a second elongated portion that are parallel with each other. The semiconductor die also includes a voltage supply line configured to route a supply voltage to the VCO, wherein the voltage supply line includes a first portion that runs parallel with the first and second elongated portions of the resonant inductor and is located between the first and second elongated portions of the resonant inductor.

A second aspect relates to a semiconductor die. The semiconductor die includes a first voltage-controlled oscillator (VCO), wherein the first VCO includes a first resonant capacitor, and a first resonant inductor coupled in parallel with the first resonant capacitor. The first resonant inductor includes a first elongated portion and a second elongated portion that are parallel with each other. The semiconductor die also includes a first voltage supply line configured to route a supply voltage to the first VCO, wherein the first voltage supply line includes a first portion that runs parallel with the first and second elongated portions of the first resonant inductor and is located between the first and second elongated portions of the first resonant inductor. The semiconductor die further includes a second voltage-controlled oscillator (VCO), wherein the second VCO includes a second resonant capacitor, and a second resonant inductor coupled in parallel with the second resonant capacitor.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the described implementations are intended to include all such aspects and their equivalents.

BRIEF DESCRIPTION OF THE DRAWINGS

FIG. 8A shows a top view of an example of a layout for a supply line and a ground line that reduces phase noise of a VCO according to certain aspects of the present disclosure.

FIG. 8B shows a side view of the layout shown in FIG. 8A according to certain aspects of the present disclosure.

FIG. 19A shows a top view of another example of output signal routing for a dual-core VCO according to certain aspects of the present disclosure.

FIG. 19B shows an unobstructed view of the exemplary output signal routing shown in FIG. 19A according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
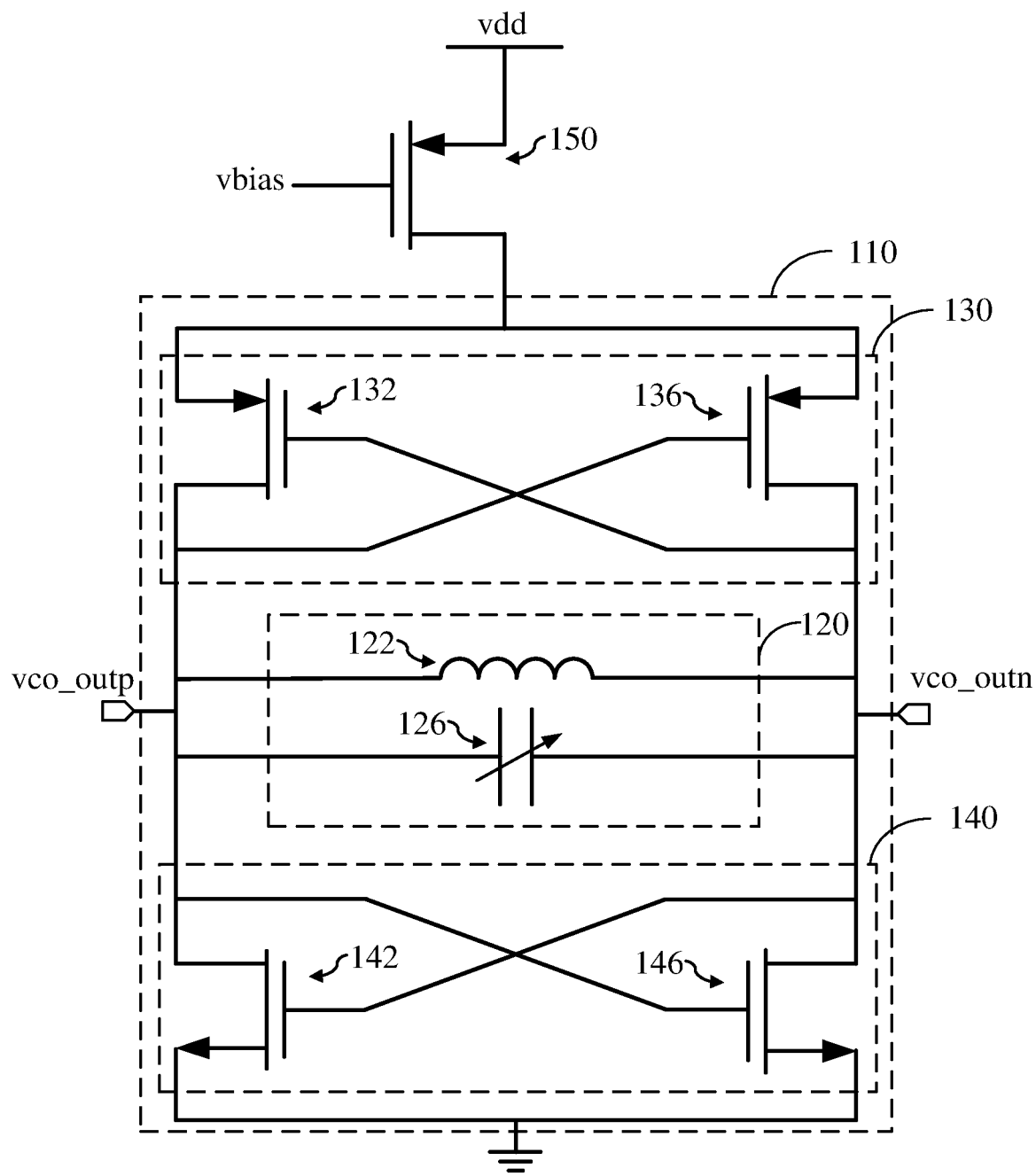
FIG. 1 shows an example of a voltage-controlled oscillator (VCO) according to certain aspects of the present disclosure.

FIG. 1 is a schematic diagram of an exemplary voltage-controlled oscillator (VCO) 110 according to certain aspects of the present disclosure. The VCO 110 includes a resonant circuit 120, a first active circuit 130, and a second active circuit 140. The resonant circuit 120 is configured to generate an oscillating signal having a frequency approximately equal to the resonant frequency of the resonant circuit 120. The resonant circuit 120 includes a resonant inductor 122 and a variable resonant capacitor 126 coupled in parallel. In this example, the resonant circuit 120 has a resonant frequency approximately equal to:

$$\text{resonance frequency} = \frac{1}{2\pi\sqrt{LC}} \quad \text{(Eq. 1)}$$

where L is the inductance of the resonant inductor 122 and C is the capacitance of the variable resonant capacitor 126. As discussed further below, the resonant frequency of the resonant circuit 120 (and hence the oscillation frequency of the VCO 110) may be tuned by tuning (i.e., adjusting) the capacitance of the variable resonant capacitor 126. In this example, the resonant circuit 120 may also be referred to as an inductor-capacitor (LC) circuit, an LC tank, a tuned circuit, or another term.

Each of the first and second active circuits 130 and 140 is configured to provide a negative resistance. The negative resistance compensates for resistive losses in the resonant circuit 120 (e.g., due to parasitic resistance) to sustain oscillation of the resonant circuit 120. In the example in FIG. 1, the first active circuit 130 includes a first p-type metal oxide semiconductor (PMOS) transistor 132 and a second PMOS transistor 136 that are cross-coupled. The gate of the first PMOS transistor 132 is coupled to the drain of the second PMOS transistor 136, and the gate of the second PMOS transistor 136 is coupled to the drain of the first PMOS transistor 132. The sources of the first and second PMOS transistors 132 and 136 are coupled to a supply voltage vdd, and the resonant circuit 120 is coupled between the drains of the first and second PMOS transistors 132 and 136. The cross-coupling of the first and second PMOS transistors 132 and 136 produces a negative resistance that is coupled in parallel with the resonant circuit 120. The negative resistance may be proportional to 1/gm, where gm is the transconductance of the first and second PMOS transistors 132 and 136. In this example, the first active circuit 130 may also be referred to as a negative resistance circuit, a negative transconductance circuit, or another term.

In the example in FIG. 1, the second active circuit 140 includes a first n-type metal oxide semiconductor (NMOS) transistor 142 and a second NMOS transistor 146 that are cross-coupled. The gate of the first NMOS transistor 142 is coupled to the drain of the second NMOS transistor 146, and the gate of the second NMOS transistor 146 is coupled to the drain of the first NMOS transistor 142. The sources of the first and second NMOS transistors 142 and 146 are coupled to ground, and the resonant circuit 120 is coupled between the drains of the first and second NMOS transistors 142 and 146. The cross-coupling of the first and second NMOS transistors 142 and 146 produces a negative resistance that is coupled in parallel with the resonant circuit 120. The negative resistance may be proportional to 1/gm, where gm is the transconductance of the first and second NMOS transistors 142 and 146. In this example, the second active circuit 140 may also be referred to as a negative resistance circuit, a negative transconductance circuit, or another term.

Although the VCO 110 includes two active circuits (i.e., the first and second active circuits 130 and 140) in the example shown in FIG. 1, it is to be appreciated that the VCO 110 may include just one active circuit to provide a negative resistance.

In the example shown in FIG. 1, the VCO 110 has a first output (labeled "vco_outp") and a second output (labeled "vco_outn"), in which the resonant circuit 120 is coupled between the first and second outputs. The VCO 110 outputs a first oscillating signal at the first output vco_outp and a second oscillating signal at the second output vco_outn. The first and second oscillating signals each have an oscillation frequency approximately equal to the resonant frequency of the resonant circuit 120, and the first oscillating signal is approximately 180 degrees out of phase with the second oscillating signal.

In the example shown in FIG. 1, the current to the VCO 110 is controlled by a current PMOS transistor 150. The source of the current PMOS transistor 150 is coupled to the supply voltage vdd, the drain of the current transistor 150 is coupled to the VCO 110, and the gate of the current PMOS transistor 150 is biased by a gate bias voltage (labeled "vbias"). In this example, the current level to the VCO 110 is controlled by the voltage level of the gate bias voltage applied to the gate of the current PMOS transistor 150. It is to be appreciated that the present disclosure is not limited to the example shown in FIG. 1. For example, instead of the current PMOS transistor 150, a current NMOS transistor (not shown) may be coupled between the VCO 110 and ground for controlling the current of the VCO 110.

The supply voltage vdd may be generated by a voltage regulator (not shown) coupled to a power distribution network (PDN). The voltage regulator may include a low dropout (LDO) regulator or another type of voltage regulator. In this example, the voltage regulator converts a supply voltage from the PDN into the supply voltage vdd.

Figure 2:
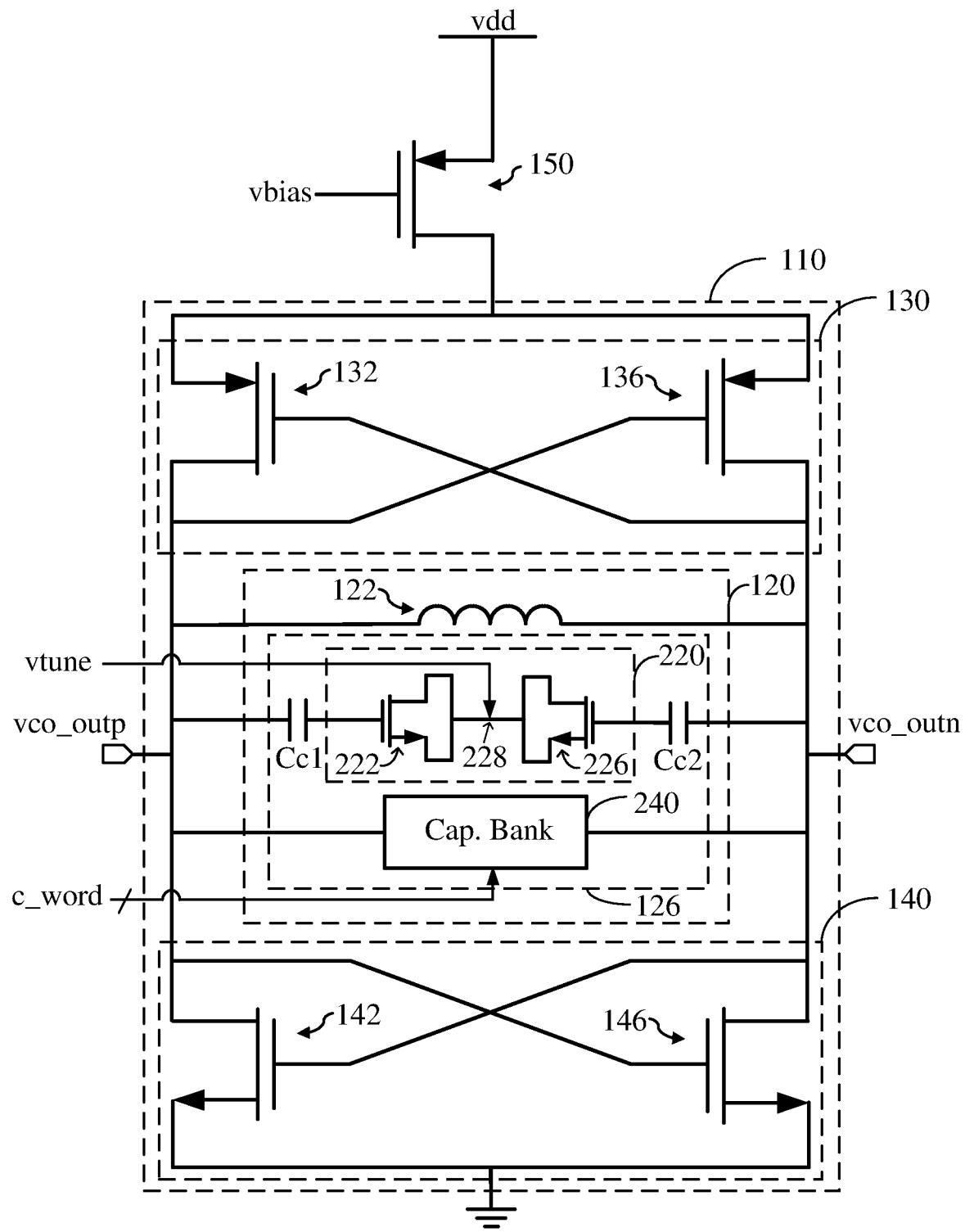
FIG. 2 shows an example of a VCO including a varactor and a capacitor bank according to certain aspects of the present disclosure.

As discussed above, the variable resonant capacitor 126 has a tunable (i.e., adjustable) capacitance. In this regard, the variable resonant capacitor 126 may include a varactor, a switchable capacitor bank, another type of variable capacitor, or any combination thereof. FIG. 2 shows an example in which the variable resonant capacitor 126 includes a varactor 220 and a switchable capacitor bank 240 coupled in parallel. As discussed further below, the varactor 220 has a voltage-controlled capacitance that is controlled by a tuning voltage (labeled "vtune").

In the example shown in FIG. 2, the varactor 220 includes a third NMOS transistor 222 and a fourth NMOS transistor 226. The gate of the third NMOS transistor 222 is AC coupled to the first output vco_outp of the VCO 110 via a first coupling capacitor (labeled "Cc1"), and the source and the drain of the third NMOS transistor 222 are coupled to a tuning node 228. The tuning voltage vtune is input to the tuning node 228. In this configuration, the third NMOS transistor 222 implements a first metal oxide semiconductor (MOS) capacitor having a capacitance that is controlled by the tuning voltage vtune.

The gate of the fourth NMOS transistor 226 is AC coupled to the second output vco_outn of the VCO 110 via a second coupling capacitor (labeled "Cc2"), and the source and the drain of the fourth NMOS transistor are coupled to the tuning node 228. In this configuration, the fourth NMOS transistor 226 implements a second MOS capacitor having a capacitance that is controlled by the tuning voltage vtune.

The capacitance of the varactor 220 is a function of the capacitances of the first and second MOS capacitors implemented by the third and fourth NMOS transistors 222 and 226, respectively. Thus, the capacitance of the varactor 220 can be tuned (i.e., adjusted) by adjusting the tuning voltage vtune. Since the capacitance of the varactor 220 contributes to the capacitance of the variable resonant capacitor 126, the resonant frequency of the resonant circuit 120 (and hence the oscillation frequency of the VCO 110) can be tuned (i.e., adjusted) by adjusting the capacitance of the varactor 220 using the tuning voltage vtune. As discussed further below, the capacitance of the varactor 220 may be tuned using the tuning voltage vtune to provide fine tuning (i.e., adjustment) of the oscillation frequency of the VCO 110.

It is to be appreciated that the varactor 220 is not limited to the example shown in FIG. 2. For example, the varactor 220 may be implemented with PMOS transistors or diodes. Although FIG. 2 shows an example in which the varactor 220 is AC coupled to the first output vco_outp and the second output vco_outn via coupling capacitors Cc1 and Cc2, respectively, it is to be appreciated that the present disclosure is not limited to this example. For example, in some implementations the varactor 220 may be DC coupled to the first output vco_outp and the second output vco_outn without the coupling capacitors Cc1 and Cc2.

The switchable capacitor bank 240 (also referred to as a capacitor array) includes multiple capacitors that can be selectively coupled in parallel and/or series using a network of switches. The capacitance of the switchable capacitor bank 240 is controlled by controlling which ones of the multiple capacitors are coupled in parallel and/or series using the switches. In one example, a multi-bit digital control signal (labeled "c_word") is input to the capacitor bank 240 to control the capacitance of the capacitor bank 240. In this example, the digital control signal c_word controls the capacitance of the capacitor bank 240 by controlling which ones of the multiple capacitors are coupled in parallel and/or series by the switches.

Figure 3:
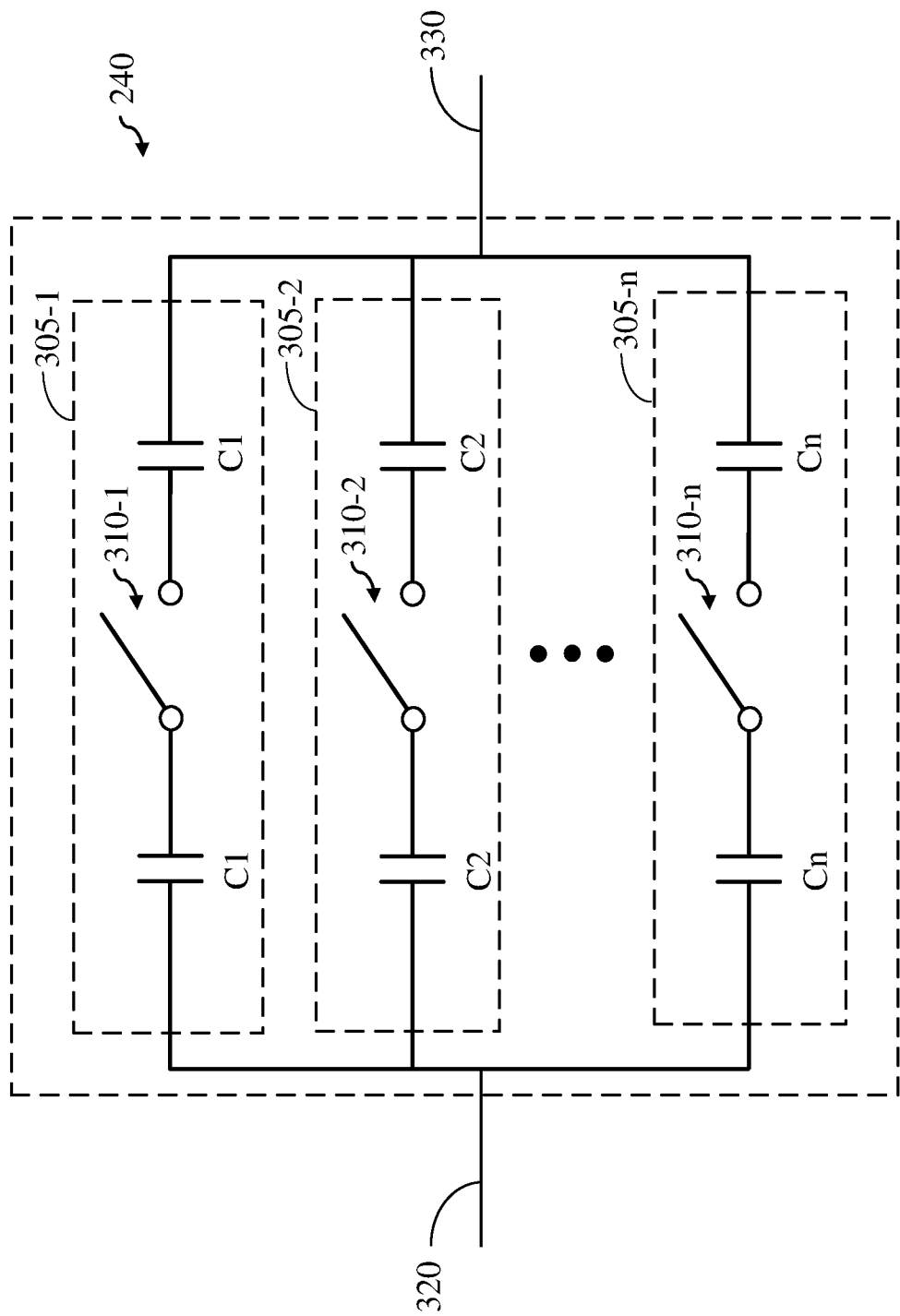
FIG. 3 shows an exemplary implementation of a capacitor bank according to certain aspects of the present disclosure.

FIG. 3 shows an exemplary implementation of the capacitor bank 240 according to certain aspects of the present disclosure. In this example, the capacitor bank 240 has a first end 320 coupled to the first output vco_outp of the VCO 110, and a second end 330 coupled to the second output vco_outn of the VCO 110. The capacitor bank 240 includes multiple branches 305-1 to 305-n coupled between the first and second ends 320 and 330 of the capacitor bank 240. Each branch 305-1 to 305-n includes a respective switch 310-1 to 310-n and a respective pair of capacitors C1 to Cn coupled in series.

In this example, the digital control signal c_word includes n control bits where each of the control bits corresponds to a respective one of the branches 305-1 to 305-n. Each of the control bits controls whether the switch 310-1 to 310-n of the respective branch 305-1 to 305-n is turned on (i.e., closed) or turned off (i.e., open). When a switch 310-1 to 310-n is turned on (i.e., closed), the respective pair of capacitors C1 to Cn contributes to the capacitance of the capacitor bank 240 between the outputs vco_outp and vco_outn of the VCO 110.

In certain aspects, the capacitor bank 240 is used to provide coarse adjustment of the oscillation frequency of the VCO 110, and the varactor 220 is used to provide fine adjustment of the oscillation frequency of the VCO 110. In one example, the capacitor bank 240 may be used to select one of multiple frequency bands, and the varactor 220 may be used to tune the oscillation frequency within the selected frequency band.

In certain aspects, the transistors 132, 136, 142 and 146 in the active circuits 130 and 140 generate device noise that may flow into the voltage supply line (also referred to as supply rail) and the ground line (also referred to as ground rail), which increases the phase noise of the VCO 110. The device noise has a frequency that is approximately equal to twice the oscillation frequency of the VCO 110. This is because each of the transistors 132, 136, 142 and 146 switches twice in one oscillation period (i.e., switches on during the first half of the oscillation period and switches off during the second half of the oscillation period, or vice versa). The device noise at twice the oscillation frequency is translated to the oscillation frequency of the VCO 110 and degrades the phase noise of the VCO 110.

Figure 4:
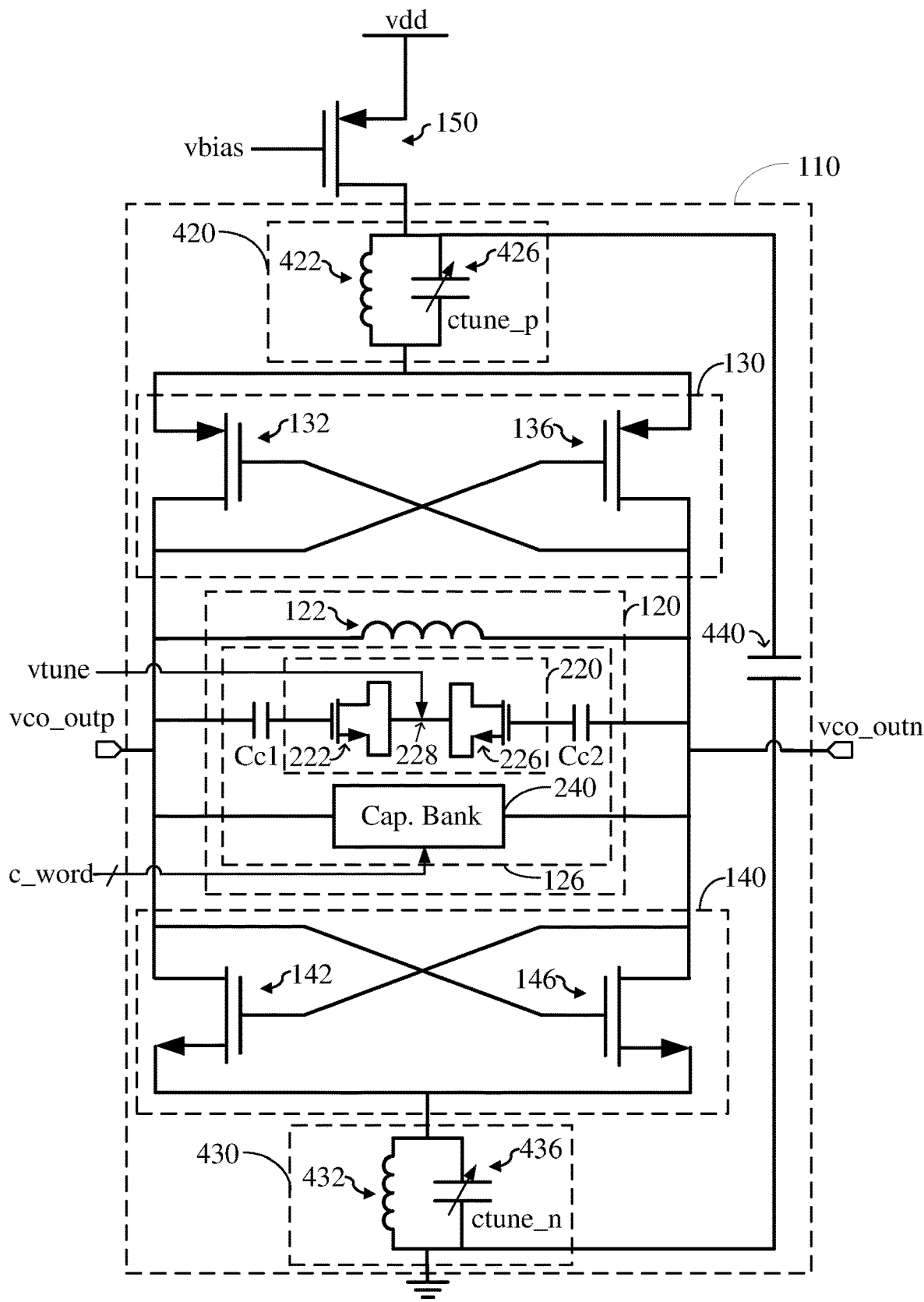
FIG. 4 shows an example of a VCO including resonant impedance circuits according to certain aspects of the present disclosure.

To address the device noise, the VCO 110 may include a first resonant impedance circuit 420 coupled between the voltage supply line and the first active circuit 130, and a second resonant impedance circuit 430 coupled between the second active circuit 140 and the ground line, as shown in FIG. 4. Each of the first and second resonant impedance circuits 420 and 430 is configured to provide a high impedance at a resonant frequency that is equal to twice the oscillation frequency of the VCO 110 (i.e., the frequency of the device noise). The high impedance of the first resonant impedance circuit 420 at the frequency of the device noise blocks the flow of the device noise into the voltage supply line, and the high impedance of the second resonant impedance circuit 420 at the frequency of the device noise blocks the flow of the device noise into the ground line. As a result, the first and second resonant impedance circuits 420 and 430 confine the device noise to the VCO 110.

In the example in FIG. 4, the first resonant impedance circuit 420 includes a first impedance inductor 422 and a first variable impedance capacitor 426 coupled in parallel. The first impedance inductor 422 and the first variable impedance capacitor 426 are each coupled between the voltage supply line and the first active circuit 130, as shown in FIG. 4. The first variable impedance capacitor 426 has a tunable capacitance (labeled "ctune_p"), and may be implemented with a varactor, a switchable capacitor bank, or another type of variable capacitor. The first resonant impedance circuit 420 has a high impedance at the resonant frequency of the first resonant impedance circuit 420, in which the resonant frequency is a function of the inductance of the first impedance inductor 422 and the capacitance of the first variable impedance capacitor 426. In certain aspects, the capacitance of the first variable impedance capacitor 426 is tuned so that the resonant frequency of the first resonant impedance circuit 420 is approximately equal to the frequency of the device noise discussed above (i.e., approximately twice the oscillation frequency of the VCO 110). This way, the first resonant impedance circuit 420 presents a high impedance to the device noise to block the device noise from the supply line. In this example, the first resonant impedance circuit 420 may also be referred to as an LC tuning network, or another term. The first impedance inductor 422 may also be referred to as a degeneration inductor ("degen" inductor for short) in the sense that the inductor 422 is coupled to the sources of the PMOS transistors 132 and 136 in the first active circuit 130 and therefore acts as a degenerating element.

The second resonant impedance circuit 430 includes a second impedance inductor 432 and a second variable impedance capacitor 436 coupled in parallel. The second impedance inductor 432 and the second variable impedance capacitor 436 are each coupled between the second active circuit 140 and the ground line. The second variable impedance capacitor 436 has a tunable capacitance (labeled "ctune_n"), and may be implemented with a varactor, a switchable capacitor bank, or another type of variable capacitor. The second resonant impedance circuit 430 has a high impedance at the resonant frequency of the second resonant impedance circuit 430, in which the resonant frequency is a function of the inductance of the second impedance inductor 432 and the capacitance of the second variable impedance capacitor 436. In certain aspects, the capacitance of the second variable impedance capacitor 436 is tuned so that the resonant frequency of the second resonant impedance circuit 430 is approximately equal to the frequency of the device noise discussed above (i.e., approximately twice the oscillation frequency of the VCO 110). This way, the second resonant impedance circuit 430 presents a high impedance to the device noise to block the device noise from the ground line. In this example, the second resonant impedance circuit 430 may also be referred to as an LC tuning network, or another term. The second impedance inductor 432 may also be referred to as a degeneration inductor ("degen" inductor for short) in the sense that the inductor 432 is coupled to the sources of the NMOS transistors 142 and 146 in the second active circuit 140 and therefore acts as a degenerating element.

Although FIG. 4 shows an example in which the VCO 110 includes two resonant impedance circuits 420 and 430 to reduce phase noise, it is to be appreciated that phase noise can be reduced with just one of the resonant impedance circuits 420 and 430. In other words, in some implementations, the VCO 110 may include just one of the resonant impedance circuits 420 and 430.

In the example in FIG. 4, the VCO 110 also includes a bypass capacitor 440 coupled between the voltage supply input of the VCO 110 and ground.

Figure 5:
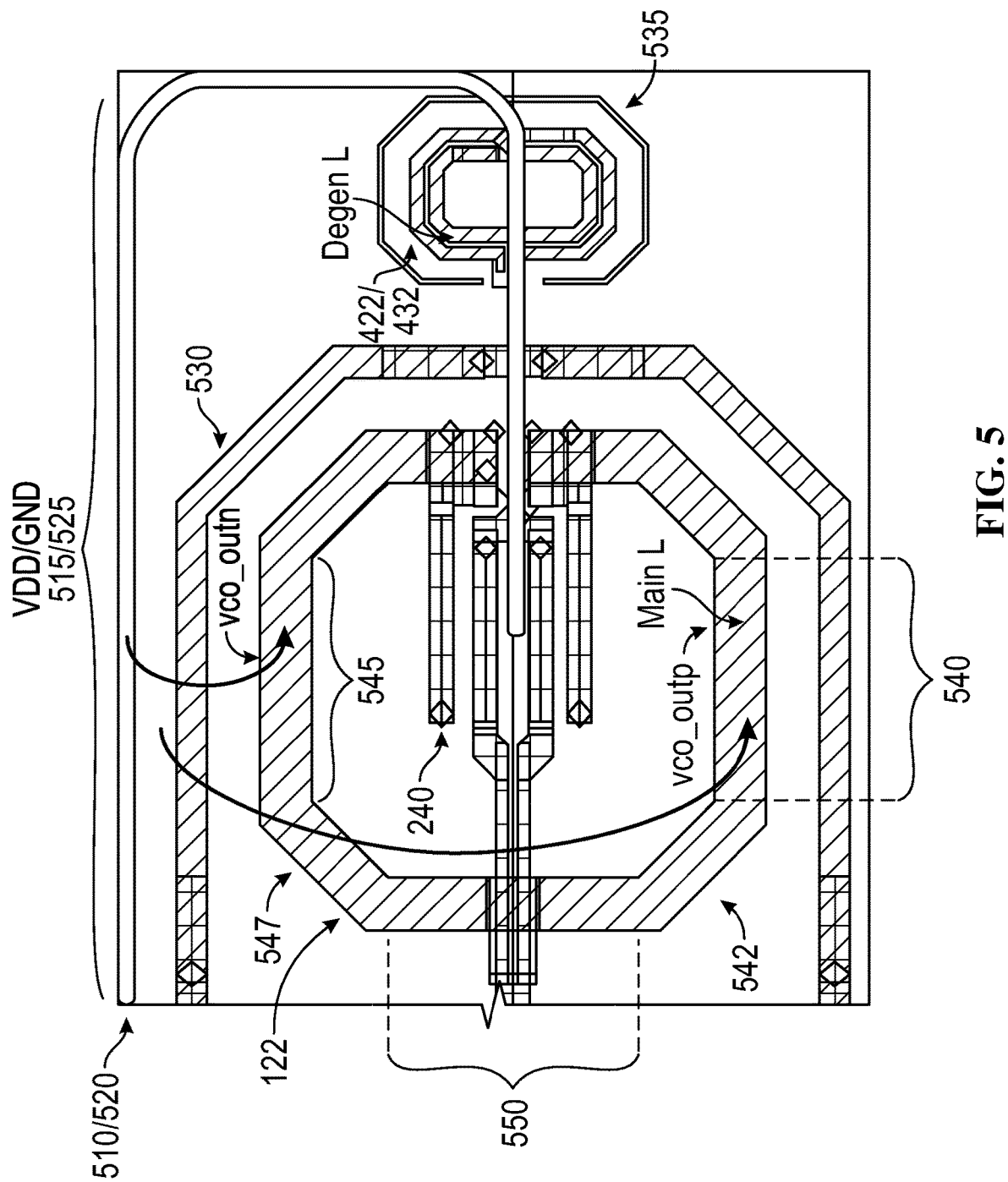
FIG. 5 shows an example of a chip layout for a VCO according to certain aspects of the present disclosure.

FIG. 5 shows a top view of an exemplary chip layout for certain components of the VCO 110 according to certain aspects of the present disclosure. In this example, the resonant inductor 122 is a planar inductor (e.g., planar loop inductor) integrated on the chip (i.e., die). The resonant inductor 122 may be formed from a metal layer on the chip (e.g., using photolithographic and etching techniques known in the art).

FIG. 5 also shows an exemplary layout for the capacitor bank 240 and one of the impedance inductors 422 and 432. In the example in FIG. 5, the VCO 110 includes one of the resonant impedance circuits 420 and 430 for phase noise reduction. However, it is to be appreciated that the layout may include both impedance inductors 422 and 432 for the example in which the VCO 110 includes both resonant impedance circuits 420 and 430. In FIG. 5, the resonant inductor 122 is referred to as "Main L" and the impedance inductor 422 or 432 is referred to as "Degen L", which is short for degeneration inductor.

Other components of the VCO 110 are not shown in FIG. 5. The other components may be coupled to the components shown in FIG. 5 by vias and/or interconnect metal routing (not shown). In this example, the impedance inductor 422 or 432 is a planar inductor (e.g., planar loop inductor) integrated on the chip (i.e., die). The impedance inductor 422 or 432 may be formed from the same metal layer as the resonant inductor 122 or a different metal layer.

In the example shown in FIG. 5, the resonant inductor 122 may be substantially surrounded by a first electromagnetic (EM) isolation ring 530. Note that the left side of the first EM isolation ring 530 is not shown in FIG. 5. The impedance inductor 422 or 432 may be substantially surrounded by a second EM isolation ring 535. The first and second EM isolation rings 530 and 535 are used to reduce magnetic coupling between the resonant inductor 122 and the impedance inductor 422 or 432 (e.g., increase isolation between the resonant inductor 122 and the impedance inductor 422 or 432). The first and second EM isolation rings 530 and 535 may be floating.

FIG. 5 also shows an example of the voltage supply routing and ground routing for the VCO 110. More particularly, FIG. 5 shows an example of a voltage supply metal line 510 (referred to as simply supply line below) for routing the supply voltage vdd (e.g., from a voltage regulator) to the VCO 110. For the example in which the VCO 110 includes the resonant impedance circuit 420, the supply line 510 may be coupled to the impedance inductor 422. For the example in which the VCO 110 does not include the resonant impedance circuit 420, the supply line 510 may be coupled to the sources of the PMOS transistors 132 and 136 in the first active circuit 130. For the example in which the current PMOS transistor 150 is used to control the current to the VCO 110, the supply line 510 may be coupled to the impedance inductor 422 via the current PMOS transistor 150 (not shown) or may extend from the current PMOS transistor 150 to the impedance inductor 422.

FIG. 5 also shows an example of a ground metal line 520 (referred to simply as ground line below) for coupling the VCO 110 to ground. For the example in which the VCO 110 includes the resonant impedance circuit 430, the ground line 520 may be coupled to the impedance inductor 432. For the example in which the VCO 110 does not include the resonant impedance circuit 430, the ground line 520 may be coupled to the sources of the NMOS transistors 142 and 146 in the second active circuit 140. For the example in which a current NMOS transistor (not shown) is used to control the current to the VCO 110, the ground line 520 may be coupled to the impedance inductor 432 via the current NMOS transistor or may extend from the current NMOS transistor to the impedance inductor 432. In FIG. 5, different shading is used to distinguish different metal layers of the die and the diamonds represent vias coupling different metal layers of the die.

The supply line 510 and the ground line 520 may run parallel to each other with a small gap separating the two lines. In FIG. 5, the supply line 510 and the ground line 520 are shown as a single thick line for ease of illustration, although it is to be appreciated that the supply line 510 and the ground line 520 are separate lines and are coupled to different structures of the VCO 11, as discussed above.

In the example shown in FIG. 5, the resonant inductor 122 is a planar loop inductor including a first elongated portion 540, a second elongated portion 545, and a third elongated portion 550. The first and second elongated portions 540 and 545 run parallel to each other, and are both perpendicular to the third elongated portion 550. The resonant inductor 122 also includes a first angled portion 542 (i.e., turn) coupling the third elongated portion 550 to the first elongated portion 540, and a second angled portion 547 (i.e., turn) coupling the third elongated portion 550 to the second elongated portion 545. The resonant inductor 122 may be a continuous metal trace in the form (i.e., shape) of a loop, in which case the inductor portions 540, 542, 545, 547 and 550 are contiguous.

In this example, the first output vco_outp of the VCO 110 is taken at the first elongated portion 540 of the resonant inductor 122 and the second output vco_outn of the VCO 110 is taken at the second elongated portion 545 of the resonant inductor 122, as indicated in FIG. 5. Note that the output metal routing from the outputs vco_outp and vco_outn of the VCO 110 is not shown in FIG. 5. The oscillating signals at the outputs vco_outp and vco_outn are approximately 180 degrees out of phase with each other, as discussed above.

In the example in FIG. 5, the supply line 510 includes a portion 515 that runs approximately parallel with the first and second elongated portions 540 and 545 of the resonant inductor 122. This portion 515 of the supply line 510 is located substantially closer to the second elongated portion 545 of the resonant inductor 122 than the first elongated portion 540 of the resonant inductor 122, as shown in FIG. 5. As a result, the inductive coupling between the supply line 510 and the second elongated portion 545 of the resonant inductor 122 (which corresponds to the second output vco_outn) is substantially stronger than the inductive coupling between the supply line 510 and the first elongated portion 540 of the resonant inductor 122 (which corresponds to the first output vco_outp).

The ground line 520 also includes a portion 525 that runs approximately parallel with the first and second elongated portions 540 and 545 of the resonant inductor 122. This portion 525 of the ground line 520 is located substantially closer to the second elongated portion 545 of the resonant inductor 122 than the first elongated portion 540 of the resonant inductor 122, as shown in FIG. 5. As a result, the inductive coupling between the ground line 520 and the second elongated portion 545 of the resonant inductor 122 (which corresponds to the second output vco_outn) is substantially stronger than the inductive coupling between the ground line 520 and the first elongated portion 540 of the resonant inductor 122 (which corresponds to the first output vco_outp).

Because each of the supply line 510 and the ground line 520 is more strongly coupled to the second elongated portion 545 of the resonant inductor 122 than the first elongated portion 540 of the resonant inductor 122, each of the supply line 510 and the ground line 520 interacts more strongly with the second output vco_outn than the first output vco_outp. The asymmetric interaction of each of the supply line 510 and the ground line 520 with the first and second outputs vco_outp and vco_outn degrades the phase noise.

Figure 6:
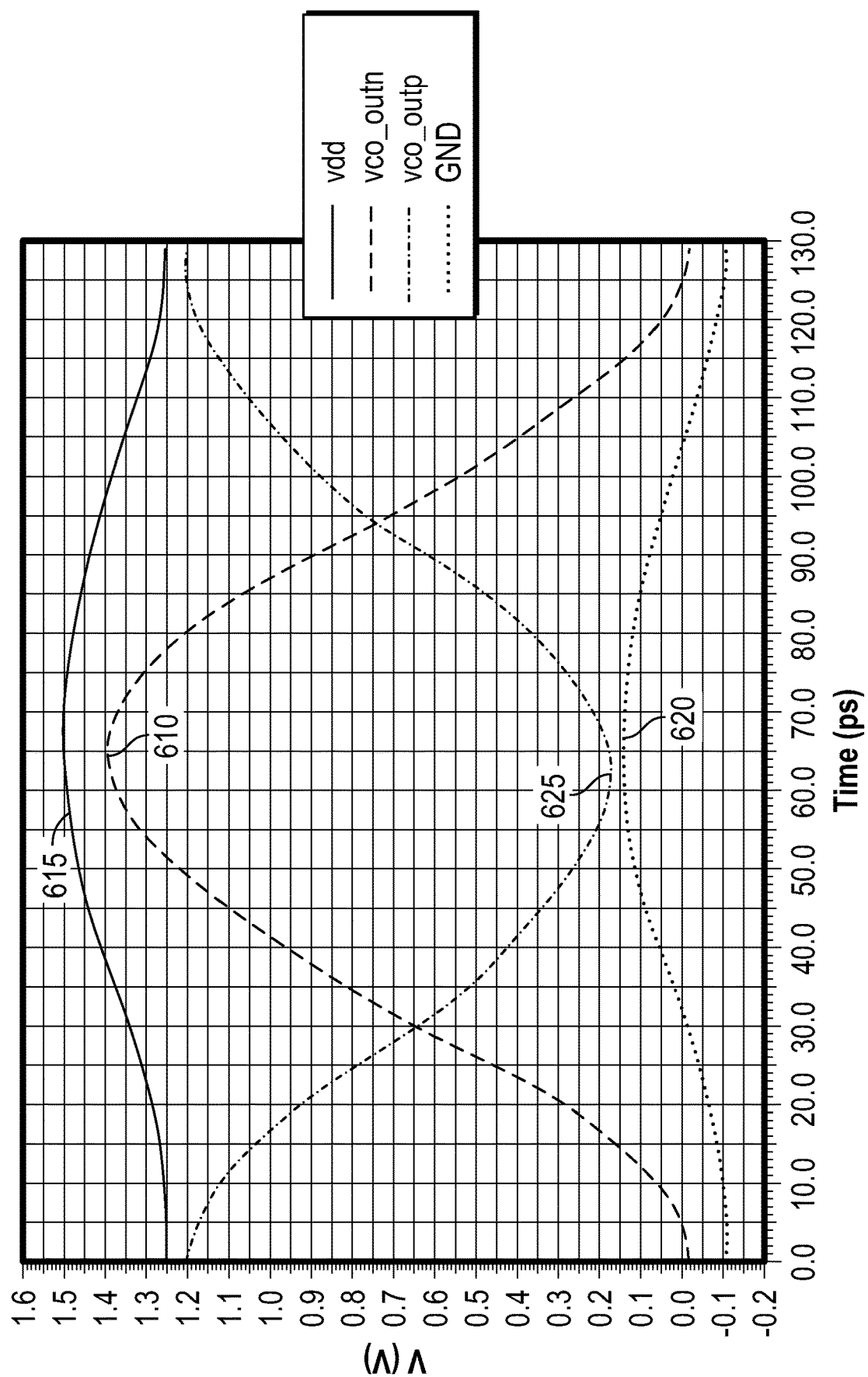
FIG. 6 is a plot showing exemplary voltage waveforms for a VCO according to certain aspects of the present disclosure.

An example of this is illustrated in FIG. 6, which shows exemplary voltage waveforms for the supply line 510 (labeled "vdd"), the ground line 520 (labeled "GND"), the first output vco_outp, and the second output vco_outn. The voltage waveforms shown in FIG. 6 were generated based on a computer simulation of the layout shown in FIG. 5. In this example, the waveforms for the first output vco_outp and the second output vco_outn are approximately sinusoidal and 180 degrees out of phase with each other. Because the supply line 510 and the ground line 520 interact more strongly with the second output vco_outn, the peak voltage 610 of the second output vco_outn causes an upward voltage bump 615 on the supply line 510 and an upward voltage bump 620 on the ground line 520, as shown in FIG. 6. Ideally, the voltages of the supply line 510 and ground line 520 should be approximately flat. The upward voltage bumps 615 and 620 on the supply line 510 and the ground line 520 cause the minimum voltage 625 of the first output vco_outp and the peak voltage 610 of the second output vco_outn to shift up, which distorts the voltage waveforms of the first and second outputs vco_outp and vco_outn and degrades the phase noise. In this example, the distortion causes the voltage waveform of the first output vco_outp to have a smaller amplitude than the voltage waveform of the second output vco_outn.

Figures 7A, 7B:
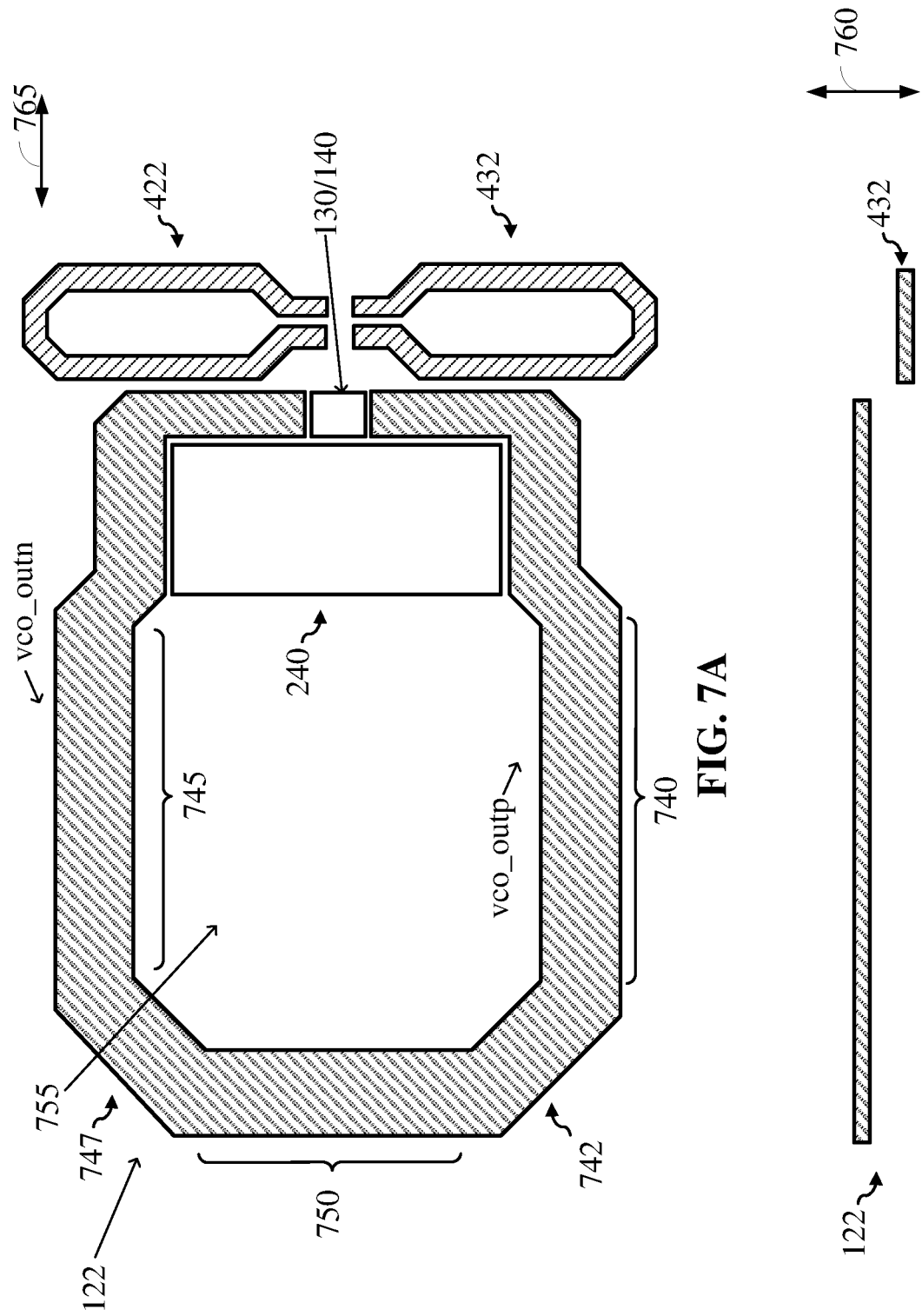
FIG. 7A shows a top view of an example of a chip layout for a VCO according to certain aspects of the present disclosure.
FIG. 7B shows a side view of the chip layout shown in FIG. 7A according to certain aspects of the present disclosure.

FIG. 7A shows a top view and FIG. 7B shows a side view of an exemplary chip layout for certain components of the VCO 110 according to certain aspects of the present disclosure. In this example, the resonant inductor 122 is a planar inductor (e.g., planar loop inductor) integrated on the chip (i.e., die). The inductor 122 is formed from a metal layer on the chip (e.g., using photolithographic and etching techniques known in the art).

FIG. 7A also shows an exemplary layout for the capacitor bank 240, the active circuits 130 and 140, and the impedance inductors 422 and 432. Note that the capacitor bank 240 and the impedance inductors 422 and 432 are not shown in FIG. 7B, and the impedance capacitors 426 and 436 are not shown in FIGS. 7A and 7B. In this example, the impedance inductors 422 and 432 are planar inductors (e.g., planar loop inductors) integrated on the chip (i.e., die). As shown in FIG. 7B, the impedance inductors 422 and 432 are formed from a different metal layer than the resonant inductor 122. This helps reduce magnetic coupling between the resonant inductor 122 and the impedance inductors 422 and 432, as discussed further below. In other implementations, the resonant inductor 122 and the impedance inductors 422 and 432 may be formed from the same metal layer.

In the example shown in FIG. 7A, the resonant inductor 122 is a planar loop inductor including a first elongated portion 740, a second elongated portion 745, and a third elongated portion 750. The first and second elongated portions 740 and 745 run parallel to each other, and are both perpendicular to the third elongated portion 750. The resonant inductor 122 also includes a first angled portion 742 (i.e., turn) coupling the third elongated portion 750 to the first elongated portion 740, and a second angled portion 747 (i.e., turn) coupling the third elongated portion 750 to the second elongated portion 745. The resonant inductor 122 may be a continuous metal trace in the form (i.e., shape) of a loop, in which case the inductor portions 740, 742, 745, 747 and 750 are contiguous.

The first output vco_outp of the VCO 110 may be taken at the first elongated portion 740 of the resonant inductor 122 and the second output vco_outn of the VCO 110 may be taken at the second elongated portion 745 of the resonant inductor 122, as indicated in FIG. 7A. Note that the output metal routing from the outputs vco_outp and vco_outn of the VCO 110 is not shown in FIG. 7A. Also, the metal routing between the resonant inductor 122 and the capacitor bank 240 is not shown in FIG. 7A. The oscillating signals at the outputs vco_outp and vco_outn are approximately 180 degrees out of phase with each other, as discussed above.

In the example in FIG. 7A, most of the magnetic flux of the resonant inductor 122 is confined to an area 755 bounded by the first, second and third elongated portions 740, 745 and 750 of the resonant inductor 122 and the left-most edge of the capacitor bank 240. This area 755 is referred to as the main magnetic flux area 755 below.

The exemplary chip layout shown in FIGS. 7A and 7B includes exemplary features that reduce magnetic coupling between the resonant inductor 122 and the impedance inductors 422 and 432. One exemplary feature is that the resonant inductor 122 is formed from a different metal layer on the chip (i.e., die) than the impedance inductors 422 and 432, as shown in FIG. 7B. In this example, the resonant inductor 122 is formed from a first metal layer on the chip and the impedance inductors 422 and 432 are formed from a second metal layer on the chip, in which an insulator (e.g., dielectric) layer is interposed between the first and second metal layers. In one example, the first metal layer is above the second metal layer in the vertical direction 760 (indicated by the double arrow in FIG. 7B). In another example, the first metal layer may be below the second metal layer in the vertical direction 760. Since the resonant inductor 122 is formed from a different metal layer than the impedance inductors 422 and 432, the resonant inductor 122 and the impedance inductors 422 and 432 are separated in the vertical direction 760. In this disclosure, the vertical direction 760 is a direction that is perpendicular to the substrate of the chip (i.e., die). The vertical separation between the resonant inductor 122 and the impedance inductors 422 and 432 increases the attenuation of magnetic fields between the resonant inductor 122 and the impedance inductors 422 and 432, thereby reducing the magnetic coupling between the resonant inductor 122 and the impedance inductors 422 and 432.

Another exemplary feature is that the main magnetic flux area 755 of the resonant inductor 122 is separated from the impedance inductors 422 and 432 in a lateral direction 765 (indicated by the double arrow in FIG. 7A). In this disclosure, the lateral direction 765 is a direction that is parallel with the substrate of the chip (i.e., die). In the example in FIG. 7A, the capacitor bank 240 and the active circuits 130 and 140 are interposed between the main magnetic flux area 755 of the resonant inductor 122 (i.e., the first and second elongated portions 740 and 745 of the resonant inductor 122) and the impedance inductors 422 and 432 in the lateral direction 765. Placement of the capacitor bank 240 and the active circuits 130 and 140 between the main magnetic flux area 755 of the resonant inductor 122 and the impedance inductors 422 and 432 in the lateral direction 765 increases the physical distance between the main magnetic flux area 755 of the resonant inductor 122 and the impedance inductors 422 and 432 in the lateral direction 765. The increased distance in the lateral direction 765 reduces the magnetic coupling between the resonant inductor 122 and the impedance inductors 422 and 432.

Placing the capacitor bank 240 and the active circuits 130 and 140 between the main magnetic flux area 755 of the resonant inductor 122 and the impedance inductors 422 and 432 also helps reduce the overall area of the VCO 110. This is because the capacitor bank 240 and the active circuits 130 and 140 fill in the chip area separating the main magnetic flux area 755 of the resonant inductor 122 from the impedance inductors 422 and 432 in the lateral direction 765 instead of leaving the chip area empty.

FIG. 8A shows a top view and FIG. 8B shows a side view of an example of voltage supply routing and ground routing for the VCO 110. The layout of the voltage supply routing and ground routing in this example substantially reduces phase noise compared with the layout shown in FIG. 5, as discussed further below.

In this example, the voltage supply routing includes a voltage supply metal line 810 (referred to as simply supply line below) configured to route the supply voltage vdd to the VCO 110. The supply line 810 has a first end 812 and a second end 814. In the example in FIG. 8A, the first end 812 of the supply line 810 is located above the resonant inductor 122 in a lateral direction 880 (indicated by a double arrow in FIG. 8A). The first end 812 may be coupled to a voltage regulator (not shown) located above the resonant inductor 122 in lateral direction 880. The second end 814 of the supply line 810 is coupled to the impedance inductor 422 of the first resonant impedance circuit 420 (e.g., by one or more vias and/or another vertical interconnect structure). In this example, the supply line 810 routes the supply voltage vdd provided by the voltage regulator to the first resonant impedance circuit 420.

In this example, the ground routing includes a ground metal line 850 (referred to as simply ground line below) configured to couple the VCO 110 to ground. The ground line 850 has a first end 852 and a second end 854. In the example in FIG. 8A, the first end 852 of the ground line 850 is located above the resonant inductor 122 in lateral direction 880. The first end 852 may be coupled to a ground rail located above the resonant inductor 122 in lateral direction 880. The second end 854 of the ground line 850 is coupled to the impedance inductor 432 of the second resonant impedance circuit 430 (e.g., by one or more vias 870 and/or another vertical interconnect structure). In this example, the ground line 850 couples the second resonant impedance circuit 430 to ground.

In the example shown in FIG. 8A, the supply line 810 and the ground line 850 run parallel to each other with a small gap separating the two lines. Each of the supply line 810 and the ground line 850 may be a respective continuous metal trace formed from a metal layer on the die that is higher than the metal layer used to form the resonant inductor 122. Because the supply line 810 and the ground line 850 are formed from a higher metal layer in this example, the supply line 810 and the ground line 850 are located above the resonant inductor 122 in the vertical direction 760, as shown in FIG. 8B. This allows the supply line 810 and the ground line 850 to pass over the resonant inductor 122. In another example, the supply line 810 and the ground line 850 may be formed from a metal layer than is lower than the metal layer used to form the resonant inductor 122. In this example, the supply line 810 and the ground line 850 may pass under the resonant inductor 122.

In the example in FIG. 8A, the supply line 810 includes a first portion 815 and a second portion 820, in which first and second portions 815 and 820 are orientated approximately perpendicular to each other. The first portion 815 of the supply line 810 runs approximately parallel with the first and second elongated portions 740 and 745 of the resonant inductor 122. The first portion 815 of the supply line 810 is located between the first and second elongated portions 740 and 745 of the resonant inductor 122. In certain aspects, the first portion 815 of the supply line 810 is placed approximately equidistant from the first and second elongated portions 740 and 745 of the resonant inductor 122. This placement causes the inductive coupling between the first portion 815 of the supply line 810 and the second elongated portion 745 of the resonant inductor 122 (which corresponds to the second output vco_outn) to be approximately equal to the inductive coupling between the first portion 815 of the supply line 810 and the first elongated portion 740 of the resonant inductor 122 (which corresponds to the first output vco_outp).

The approximately equal inductive coupling between the first portion 815 of the supply line 810 and each of the first and second elongated portions 740 and 745 of the resonant inductor 122 substantially reduces phase noise. This is because the first and second oscillating signals at the first and second outputs vco_outp and vco_outn, respectively, are approximately 180 degrees out of phase with each other. As a result, with approximately equal inductive coupling between the first portion 815 of the supply line and each of the first and second elongated portions 740 and 745 of the resonant inductor 122, the effects of the first and second outputs vco_outp and vco_outn on the first portion 815 of the supply line 810 approximately cancel each other out.

The second portion 820 of the supply line 810 is oriented approximately perpendicular to the first and second elongated portions 740 and 745 of the resonant inductor 122. The perpendicular orientation substantially reduces coupling between the second portion 820 of the supply line 810 and the first and second elongated portions 740 and 745 of the resonant inductor 122. The second portion 820 of the supply line 810 extends upward from the first portion 815 of the supply line 810 in lateral direction 880, and passes over the second elongated portion 745 of the resonant inductor 122. Thus, the second portion 820 of the supply line 810 facilitates supply routing to a voltage regulator or another structure located above the resonant inductor 122 in lateral direction 880.

In the example shown in FIG. 8A, the ground line 850 includes a first portion 855 and a second portion 860, in which the first and second portions 855 and 860 are orientated approximately perpendicular to each other. The first portion 855 of the ground line 850 runs approximately parallel with the first and second elongated portions 740 and 745 of the resonant inductor 122. The first portion 855 of the ground line 850 is located between the first and second elongated portions 740 and 745 of the resonant inductor 122. In certain aspects, the first portion 855 of the ground line 850 is placed approximately equidistant from the first and second elongated portions 740 and 745 of the resonant inductor 122. This placement causes the inductive coupling between the first portion 855 of the ground line 850 and the second elongated portion 745 of the resonant inductor 122 (which corresponds to the second output vco_outn) to be approximately equal to the inductive coupling between the first portion 855 of the ground line 850 and the first elongated portion 740 of the resonant inductor 122 (which corresponds to the first output vco_outp).

The approximately equal inductive coupling between the first portion 855 of the ground line 850 and each of the first and second elongated portions 740 and 745 of the resonant inductor 122 substantially reduces phase noise. This is because the first and second oscillating signals at the first and second outputs vco_outp and vco_outn, respectively, are approximately 180 degrees out of phase with each other. As a result, with approximately equal inductive coupling between the first portion 855 of the ground line 850 and each of the first and second elongated portions 740 and 745 of the resonant inductor 122, the effects of the first and second outputs vco_outp and vco_outn on the first portion 855 of the ground line 850 approximately cancel each other out.

The second portion 860 of the ground line 850 is oriented approximately perpendicular to the first and second elongated portions 740 and 745 of the resonant inductor 122. The perpendicular orientation substantially reduces coupling between the second portion 860 of the ground line 850 and the first and second elongated portions 740 and 745 of the resonant inductor 122. The second portion 860 of the ground line 850 extends upward from the first portion 855 of the ground line 850 in lateral direction 880, and passes over the second elongated portion 745 of the resonant inductor 122. Thus, the second portion 860 of the ground line 850 facilitates ground routing to a structure (e.g., ground rail) located above the resonant inductor 122 in lateral direction 880.

Figure 9:
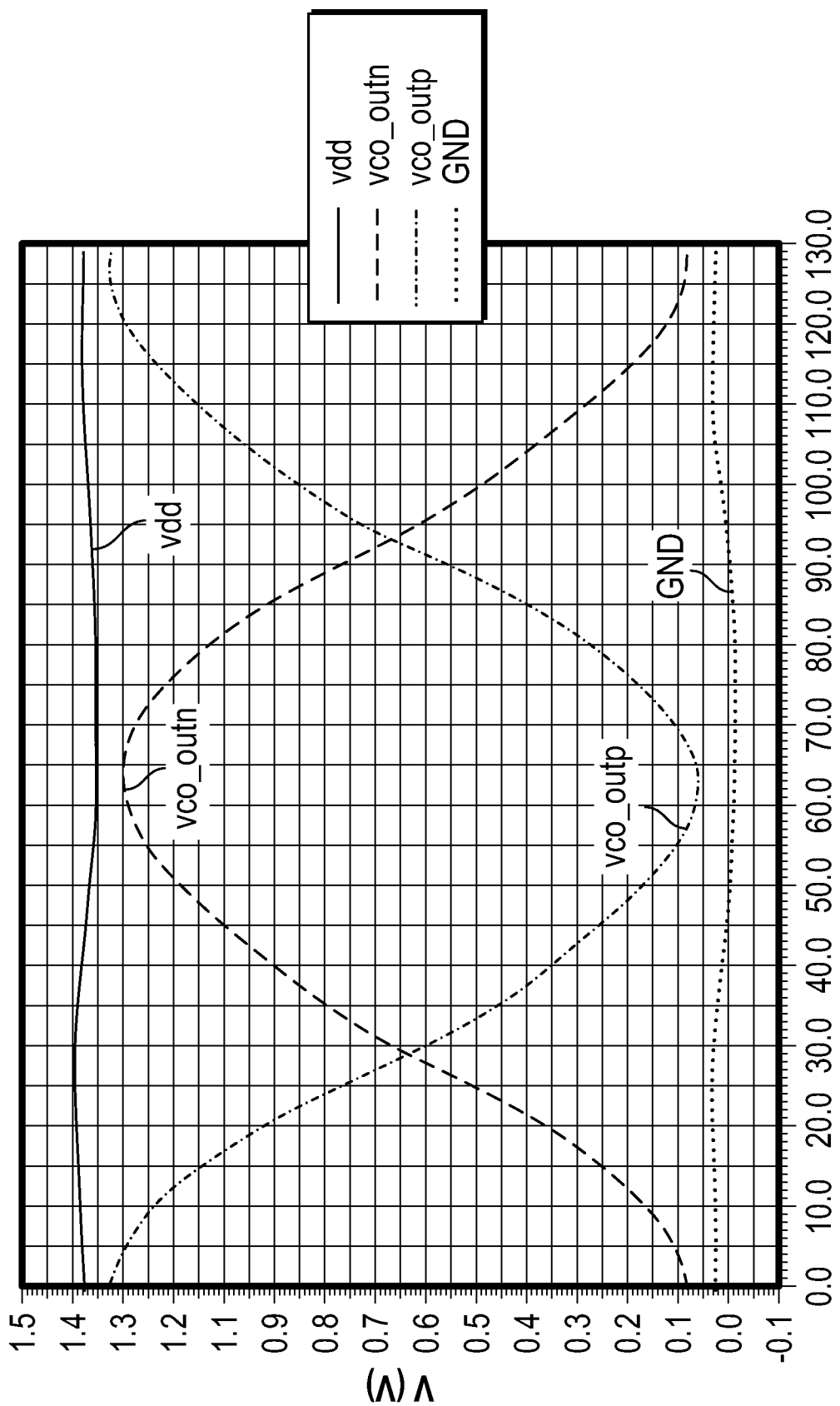
FIG. 9 is a plot showing exemplary voltage waveforms for a VCO with reduced phase noise according to certain aspects of the present disclosure.

FIG. 9 shows exemplary voltage waveforms for the supply line 810 (labeled "vdd"), the ground line 850 (labeled "GND"), the first output vco_outp, and the second output vco_outn for the exemplary layout shown in FIGS. 8A and 8B. The voltage waveforms shown in FIG. 9 were generated based on a computer simulation of the layout shown in FIGS. 8A and 8B. In this example, the waveforms for the first output vco_outp and the second output vco_outn are approximately sinusoidal and 180 degrees out of phase with each other. Because the supply line 810 interacts approximately equally with the first and second outputs vco_outp and vco_outn, the effects of the first and second outputs vco_outp and vco_outn on the supply line 810 approximately cancel each other out. Similarly, the effects of the first and second outputs vco_outp and vco_outn on the ground line 850 approximately cancel each other out. As a result, the voltages of the supply line 810 and ground line 850 stay approximately flat, and the voltage waveforms of the first and second outputs vco_outp and vco_outn have approximately the same amplitude.

In the example shown in FIGS. 8A and 8B, the supply line 810 provides supply routing between the VCO 110 and a voltage regulator (not shown) or another structure located above the resonant inductor 122 in lateral direction 880. Similarly, the ground line 850 provides ground routing between the VCO 110 and a structure (e.g., ground rail) located above the resonant inductor 122 in lateral direction 880. However, it is to be appreciated that the present disclosure is not limited to this example.

Figure 10:
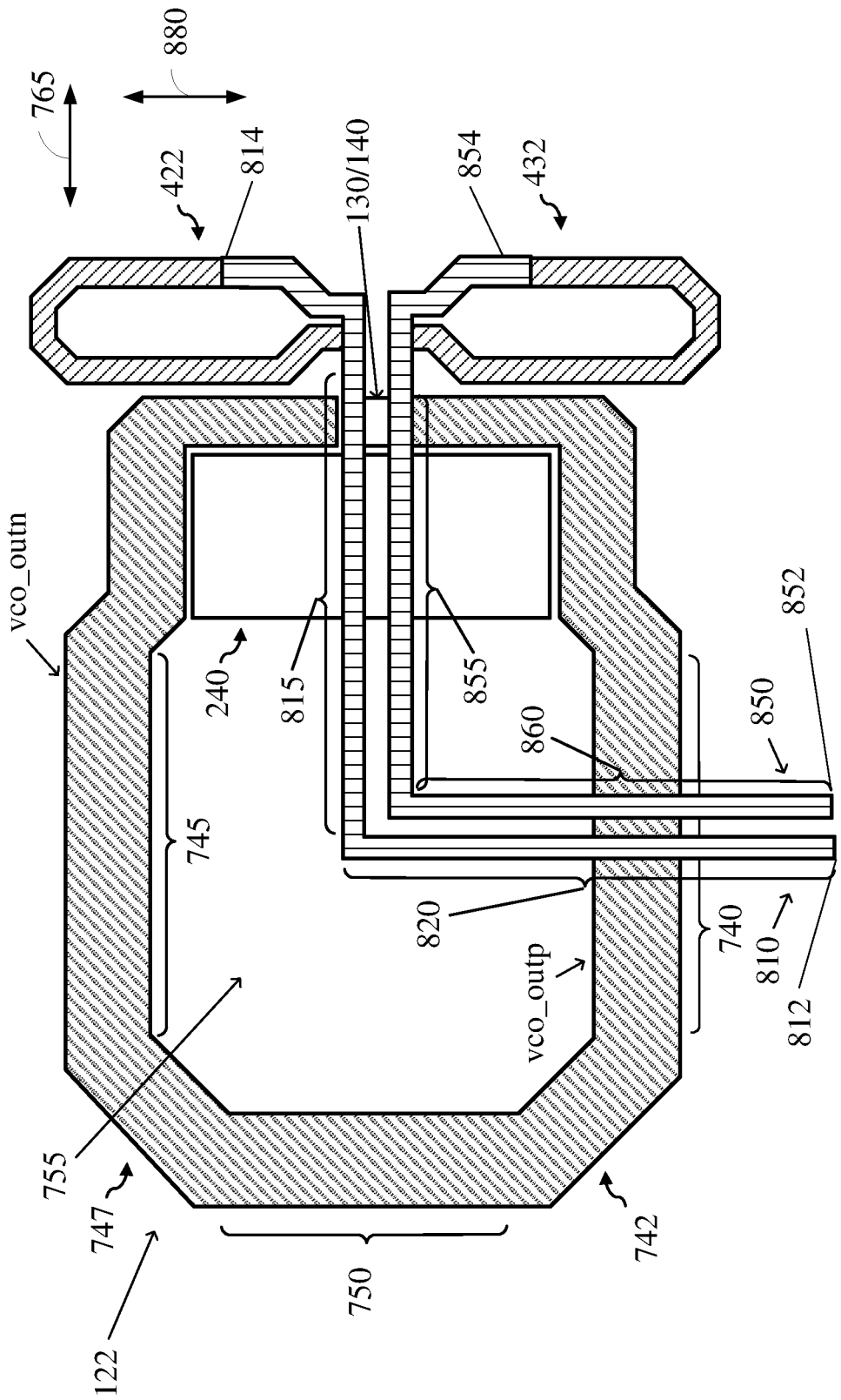
FIG. 10 shows another example of a layout for a supply line and a ground line that reduces phase noise of a VCO according to certain aspects of the present disclosure.

For example, FIG. 10 shows an example in which the supply line 810 provides supply routing between the VCO 110 and a voltage regulator (not shown) or another structure located below the resonant inductor 122 in lateral direction 880, and the ground line 850 provides ground routing between the VCO 110 and a structure (e.g., ground rail) located below the resonant inductor 122 in lateral direction 880. In this example, the second portion 820 of the supply line 810 extends downward from the first portion 815 of the supply line 810 in lateral direction 880, and passes over the first elongated portion 740 of the resonant inductor 122. Similarly, the second portion 860 of the ground line 850 extends downward from the first portion 855 of the ground line 850 in lateral direction 880, and passes over the first elongated portion 740 of the resonant inductor 122.

Figure 11:
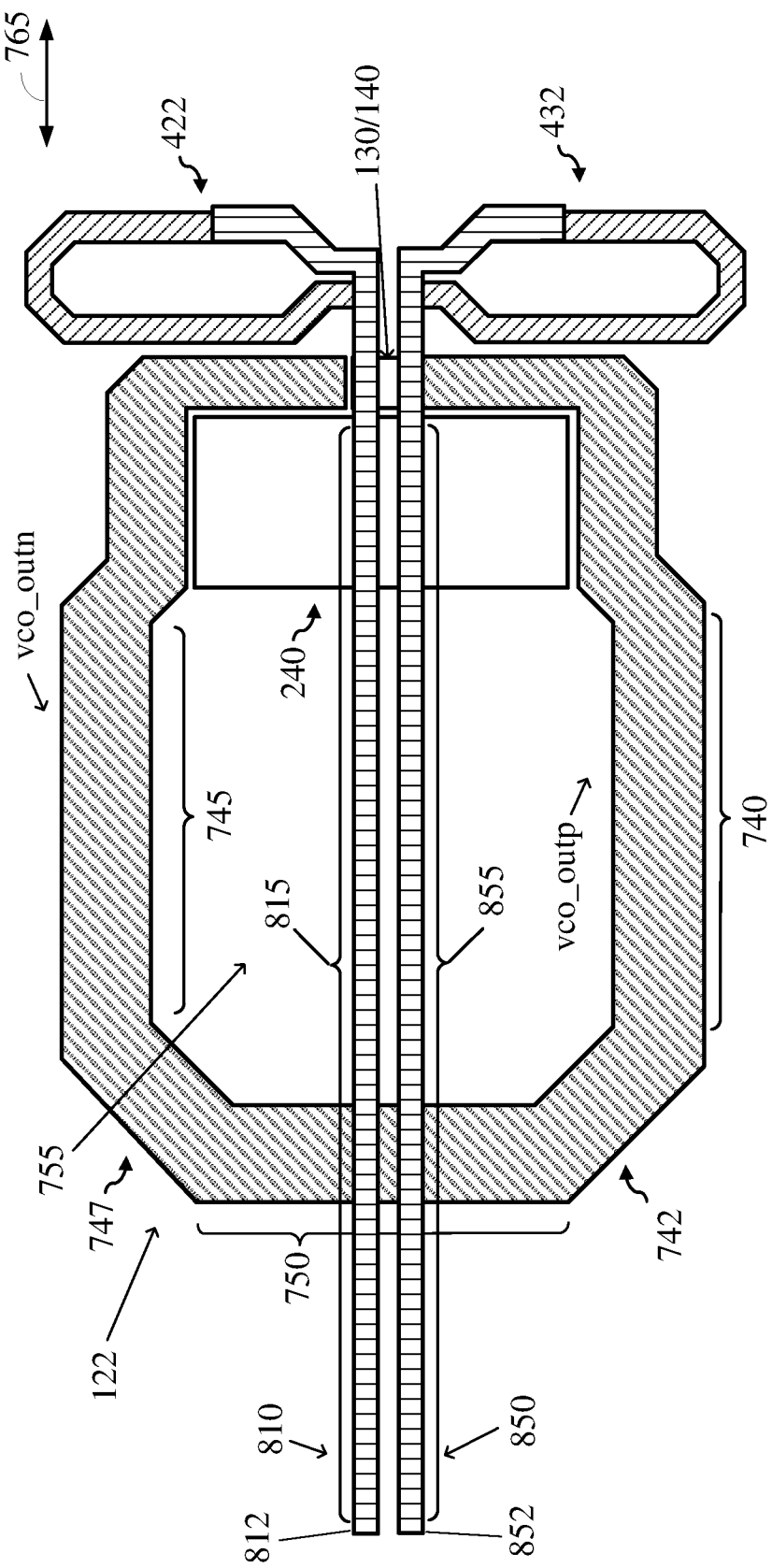
FIG. 11 shows still another example of a layout for a supply line and a ground line that reduces phase noise of a VCO according to certain aspects of the present disclosure.

FIG. 11 shows another example in which the supply line 810 provides supply routing between the VCO 110 and a voltage regulator (not shown) or another structure located to the left of the resonant inductor 122 in lateral direction 765, and the ground line 850 provides ground routing between the VCO 110 and a structure (e.g., ground rail) located to the left the resonant inductor 122 in lateral direction 765. In this example, the first portion 815 of the supply line 810 extends to the left of the resonant inductor 122 in lateral direction 765, and passes over the third elongated portion 750 of the resonant inductor 122. Similarly, the first portion 855 of the ground line 850 extends to the left of the resonant inductor 122 in lateral direction 765, and passes over the third elongated portion 750 of the resonant inductor 122.

Figure 12:
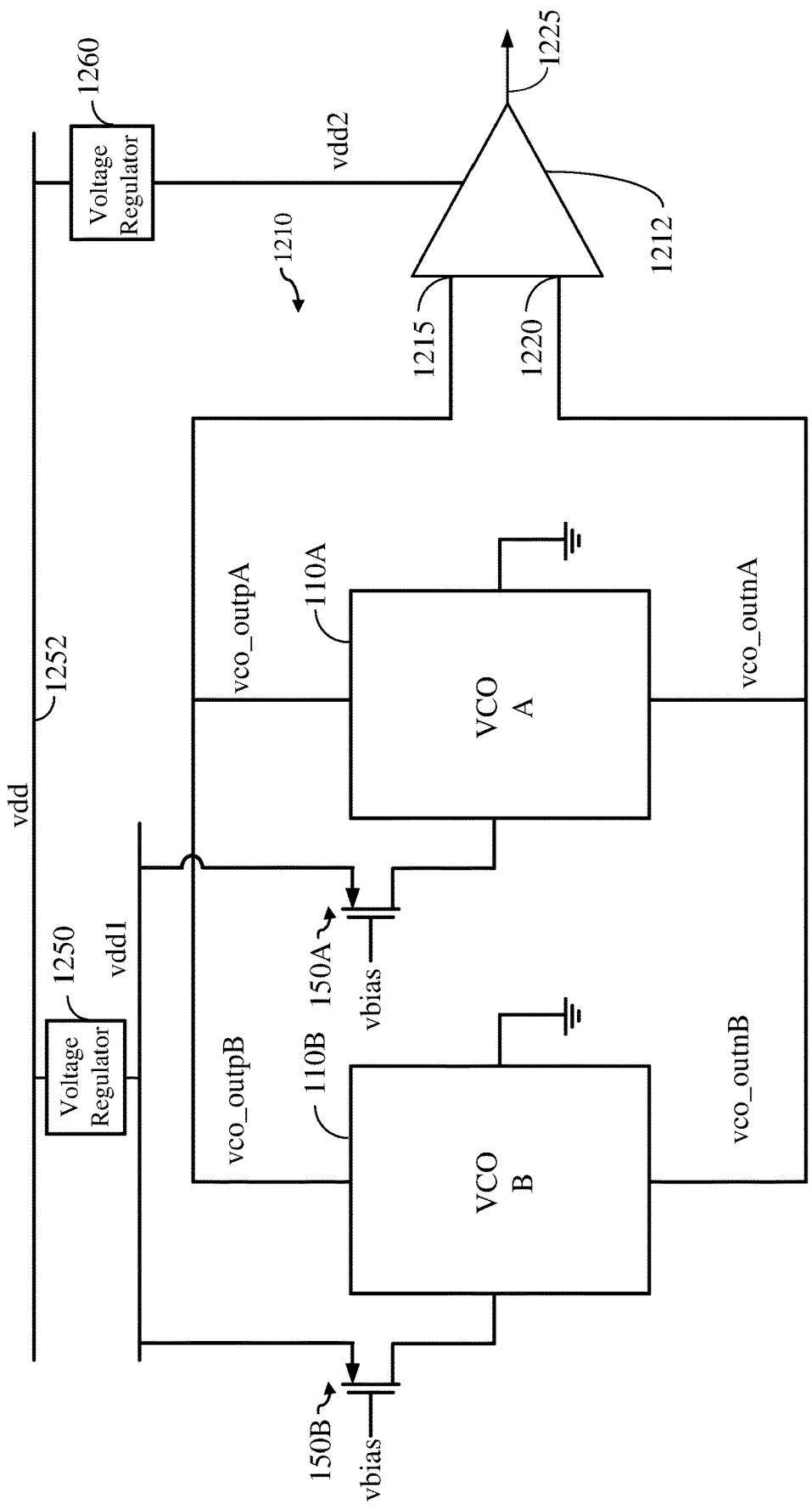
FIG. 12 shows an example of a dual-core VCO according to certain aspects of the present disclosure.
Figure 13:
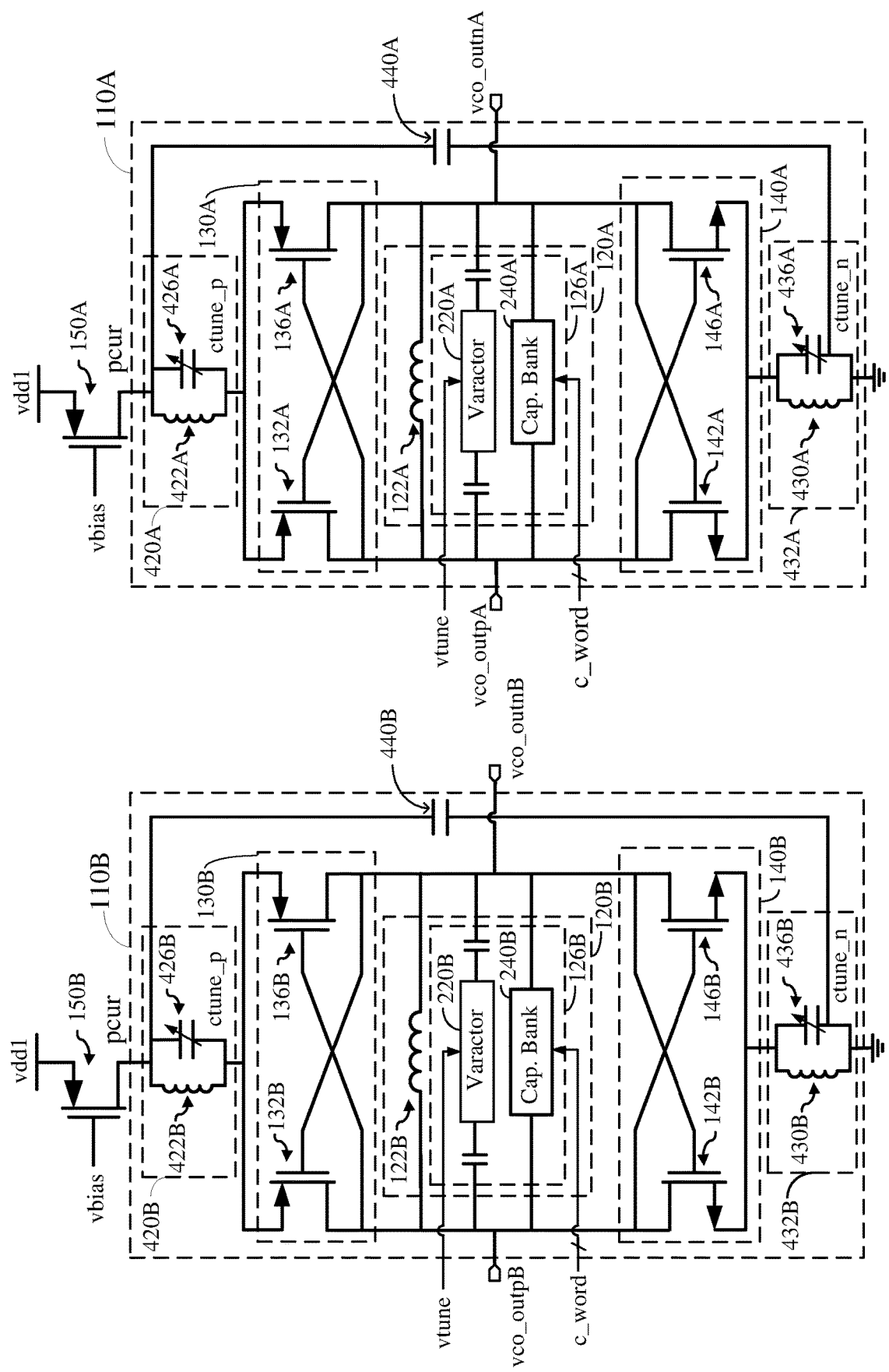
FIG. 13 shows an exemplary implementation of a first VCO and a second VCO according to certain aspects of the present disclosure.

FIG. 12 shows an exemplary dual-core VCO 1210 including a first VCO 110A and a second VCO 110B according to certain aspects of the present disclosure. Each of the first and second VCOs 110A and 110B may be a separate instance (i.e., copy) of the exemplary VCO 110 shown in FIG. 4. In this regard, FIG. 13 shows an example in which each of the first and second VCOs 110A and 110B is implemented with the exemplary VCO 110 shown in FIG. 4. To distinguish between the components of the first and second VCOs 110A and 110B in FIG. 13, the letter "A" is appended to the reference numbers for the components of the first VCO 110A and the letter "B" is appended to the reference numbers for the components of the second VCO 110B. The description of the exemplary VCO 110 provided above applies to each of the first and second VCOs 110A and 110B in this example, and is therefore not repeated here for brevity.

Returning to FIG. 12, the dual-core VCO 1210 includes a buffer 1212 having a differential input and an output 1225. The output 1225 of the buffer 1212 may be single ended or differential. The differential input of the buffer 1212 includes a first input 1215 and a second input 1220. The first output vco_outpA of the first VCO 110A and the first output vco_outpB of the second VCO 110B are coupled to the first input 1215 of the buffer 1212. As a result, the output signal from the first output vco_outpA of the first VCO 110A and the output signal from the first output vco_outpB of the second VCO 110B are combined into a combined signal that is input to the first input 1215 of the buffer 1212. The second output vco_outnA of the first VCO 110A and the second output vco_outnB of the second VCO 110B are coupled to the second input 1220 of the buffer 1212. As a result, the output signal from the second output vco_outnA of the first VCO 110A and the output signal from the second output vco_outnB of the second VCO 110B are combined into a combined signal that is input to the second input 1220 of the buffer 1212.

The combined signals at the first and second inputs 1215 and 1220 of the buffer 1212 constitute a combined differential signal (e.g., differential sinusoidal signal) that is generated by combining the differential output signals of the first and second VCOs 110A and 110B. Combining the differential output signals of the first and second VCOs 110A and 110B increases the signal strength by approximately 6 dB over a single VCO while only increasing noise by approximately 3 dB. This is because noise from the first VCO 110A is statistically uncorrelated with noise from the second VCO 110B. As a result, combining the noise from the first VCO 110A and the noise from the second VCO 110B results in only a 3 dB increase in noise compared with the 6 dB increase in the signal. This translates into a net 3 dB gain in the SNR of the dual-core VCO 1210 compared with a single VCO.

In one example, the output 1225 of the buffer 1212 is coupled to a local oscillator (LO) generator (not shown in FIG. 12). In this example, the LO generator converts the output signal of the buffer 1212 into an LO signal, as discussed further below. The output 1225 of the buffer 1212 may also be coupled to a frequency divider (not shown in FIG. 12) that is part of a phase-locked loop (PLL) that controls the tuning voltage vtune of the first and second VCOs 110A and 110B, as discussed further below.

In certain aspects, the first and second VCOs 110A and 110B may be powered using a first supply voltage (labeled "vdd1") and the buffer 1212 may be powered using a second supply voltage (labeled "vdd2"). In one example, the first supply voltage vdd1 is higher than the second supply voltage vdd2. In this example, the higher voltage for the first supply voltage vdd1 translates into a higher voltage swing for each of the VCOs 110A and 110B, which leads to a higher signal-to-noise ratio (SNR) for a given amount of noise. The higher supply voltage comes with higher power consumption. However, for the VCOs 110A and 110B, the increase in power consumption from using the higher supply voltage for vdd1 may be offset by the increase in performance. The buffer 1212 may have low noise compared with the VCOs 110A and 110B, and therefore may be powered by a lower supply voltage to reduce power consumption.

The first supply voltage vdd1 may be provided by a first voltage regulator 1250 and the second supply voltage vdd2 may be provided by a second voltage regulator 1260, as shown in FIG. 12. In this example, the first voltage regulator 1250 (e.g., a first LDO) is coupled to a voltage supply rail 1252 (e.g., of a PDN) and each of the VCOs 110A and 110B. The first voltage regulator 1250 is configured to convert the supply voltage vdd on the voltage supply rail 1252 into the first supply voltage vdd1, which is provided to the VCOs 110A and 110B.

The second voltage regulator 1260 (e.g., a second LDO) is coupled to the voltage supply rail 1252 and the buffer 1212. The second voltage regulator 1260 is configured to convert the supply voltage vdd on the voltage supply rail 1252 into the second supply voltage vdd2, which is provided to the buffer 1212. Although the first and second voltage regulators 1250 and 1260 are coupled to the same supply rail 1252 in the example in FIG. 12, it is to be appreciated that the first and second voltage regulators 1250 and 1260 may be coupled to different supply rails.

In the example shown in FIG. 12, the first VCO 110A is coupled to the first supply voltage Vdd1 via a first current PMOS transistor 150A, which controls current to the first VCO 110A based on a bias voltage (labeled "vbias"). Similarly, the second VCO 110B is coupled to the first supply voltage Vdd1 via a second current PMOS transistor 150B, which controls current to the second VCO 110B based on the bias voltage vbias. It is to be appreciated that the first and second current PMOS transistors 150A and 150B may be omitted. For example, the currents of the first and second VCOs 110A and 110B may be controlled using other types of transistors.

Figure 14:
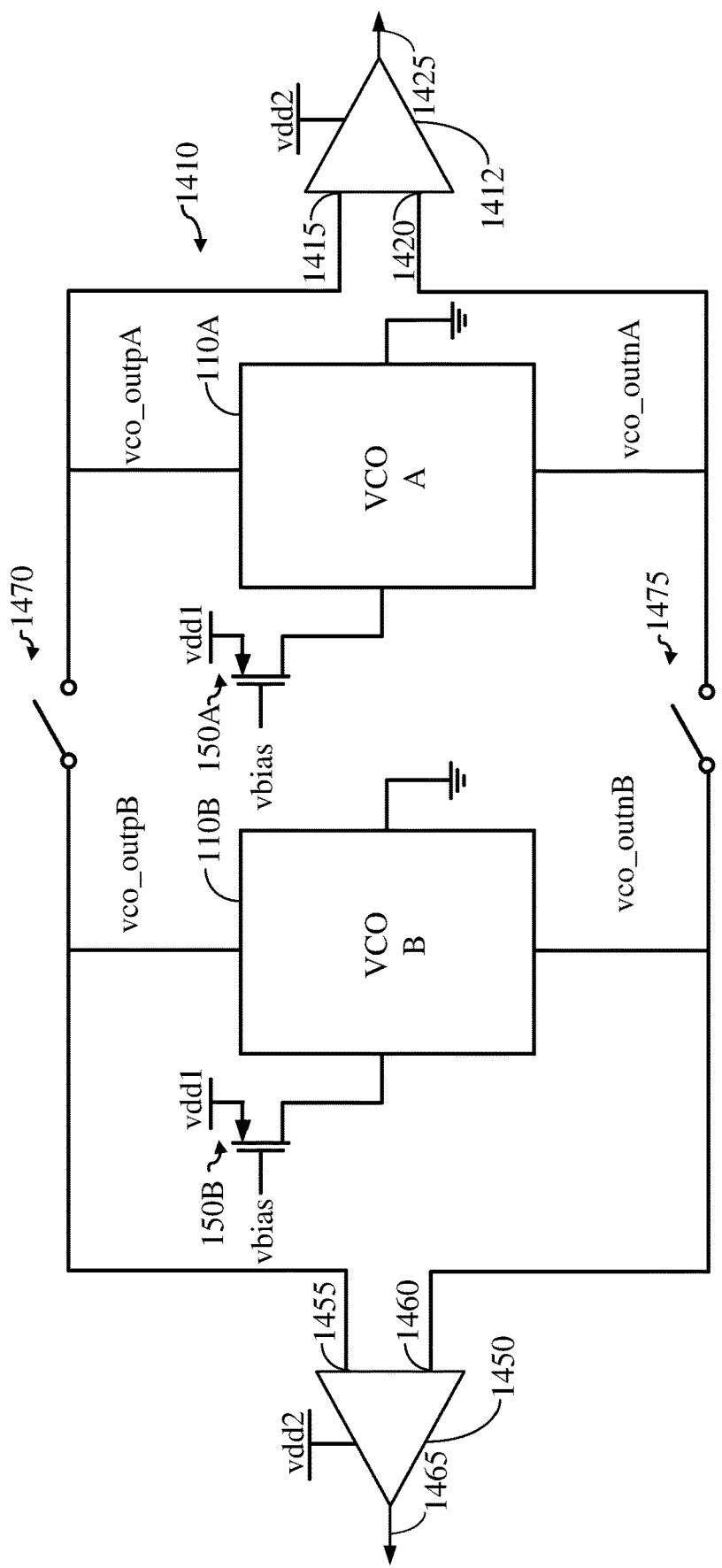
FIG. 14 shows another example of a dual-core VCO according to certain aspects of the present disclosure.

FIG. 14 shows another exemplary dual-core VCO 1410 including the first VCO 110A and the second VCO 110B. As discussed above, each of the first and second VCOs 110A and VCO 110B may be implemented with the exemplary VCO 110 shown in FIG. 4, an example of which is shown in FIG. 13.

The dual-core VCO 1410 includes a first buffer 1412 and a second buffer 1450. The first buffer 1412 has a differential input and an output 1425. The output 1425 of the first buffer 1412 may be single ended or differential. The differential input of the first buffer 1412 includes a first input 1415 and a second input 1420. The first output vco_outpA of the first VCO 110A is coupled to the first input 1415 of the first buffer 1412, and the second output vco_outnA of the first VCO 110A is coupled to the second input 1420 of the first buffer 1412. Each of the first and second buffers 1412 and 1450 may be powered using the second supply voltage vdd2. For the example in which the second supply voltage vdd2 is provided by the second voltage regulator 1260 shown in FIG. 12, each of the first and the second buffers 1412 and 1450 may be coupled to the second voltage regulator 1260.

The second buffer 1450 has a differential input and an output 1465. The output 1465 of the second buffer 1450 may be single ended or differential. The differential input of the second buffer 1450 includes a first input 1455 and a second input 1460. The first output vco_outpB of the second VCO 110B is coupled to the first input 1455 of the second buffer 1450, and the second output vco_outnB of the second VCO 110B is coupled to the second input 1460 of the second buffer 1450.

The dual-core VCO 1410 also includes a first switch 1470 and a second switch 1475. The first switch 1470 is coupled between the first input 1415 of the first buffer 1412 and the first input 1455 of the second buffer 1450. The second switch 1475 is coupled between the second input 1420 of the first buffer 1412 and the second input 1460 of the second buffer 1465.

In certain aspects, the dual-core VCO 1410 is configured to operate in a dual-core mode or a single-core mode depending on the on/off states of the first and second switches 1470 to 1475. To operate the dual-core VCO 1410 in the dual-core mode, the first and second switches 1470 and 1475 are turned on (i.e., closed). In this mode, the first output vco_outpB of the second VCO 110B is coupled to the first input 1415 of the first buffer 1412 via the first switch 1470. As a result, the output signal from the first output vco_outpB of the second VCO 110B is combined with the output signal from the first output vco_outpA of the first VCO 110A into a combined signal that is input to the first input 1415 of the first buffer 1412. Similarly, the second output vco_outnB of the second VCO 110B is coupled to the second input 1420 of the first buffer 1412 via the second switch 1475. As a result, the output signal from the second output vco_outnB of the second VCO 110B is combined with the output signal from the second output vco_outnA of the first VCO 110A into a combined signal that is input to the second input 1420 of the first buffer 1412.

Thus, in the dual-core mode, the differential output signals of the first and second VCOs 110A and 110B are combined and input to the differential input of the first buffer 1412. In one example, the output 1425 of the first buffer 1412 may be coupled to the LO generator discussed above. In this example, the first buffer 1412 drives the LO generator with the combined signal of the first and second VCOs 110A and 110B.

In the dual-core mode, the first output vco_outpA of the first VCO 110A is coupled to the first input 1455 of the second buffer 1450 via the first switch 1470. As a result, the output signal from the first output vco_outpA of the first VCO 110A is combined with the output signal from the first output vco_outpB of the second VCO 110B into a combined signal that is input to the first input 1455 of the second buffer 1465. Similarly, the second output vco_outnA of the first VCO 110A is coupled to the second input 1460 of the second buffer 1450 via the second switch 1475. As a result, the output signal from the second output vco_outnA of the first VCO 110A is combined with the output signal from the second output vco_outnB of the second VCO 110B into a combined signal that is input to the second input 1460 of the second buffer 1465.

Thus, in the dual-core mode, the differential output signals of the first and second VCOs 110A and 110B are combined and input to the differential input of the second buffer 1450. The output 1465 of the second buffer 1450 may be coupled to the frequency divider (not shown) of the PLL discussed above. In this example, the second buffer 1450 drives the frequency divider with the combined signal of the first and second VCOs 110A and 110B.

To operate in the single-core mode, the first and second switches 1470 and 1475 are turned off (i.e., open). In this mode, the first and second outputs vco_outpA and vco_outnA of the first VCO 110A are coupled to the first and second inputs 1415 and 1420, respectively, of the first buffer 1412. The first buffer 1412 may drive the LO generator with the output signal of the first VCO 110A. The first buffer 1412 may also drive the frequency divider with the output signal of the first VCO 110A. Thus, in the single-core mode, the first buffer 1412 may drive both the LO generator and the frequency divider. In the single-core mode, the second VCO 110B and the second buffer 1450 may be powered off.

Figure 15:
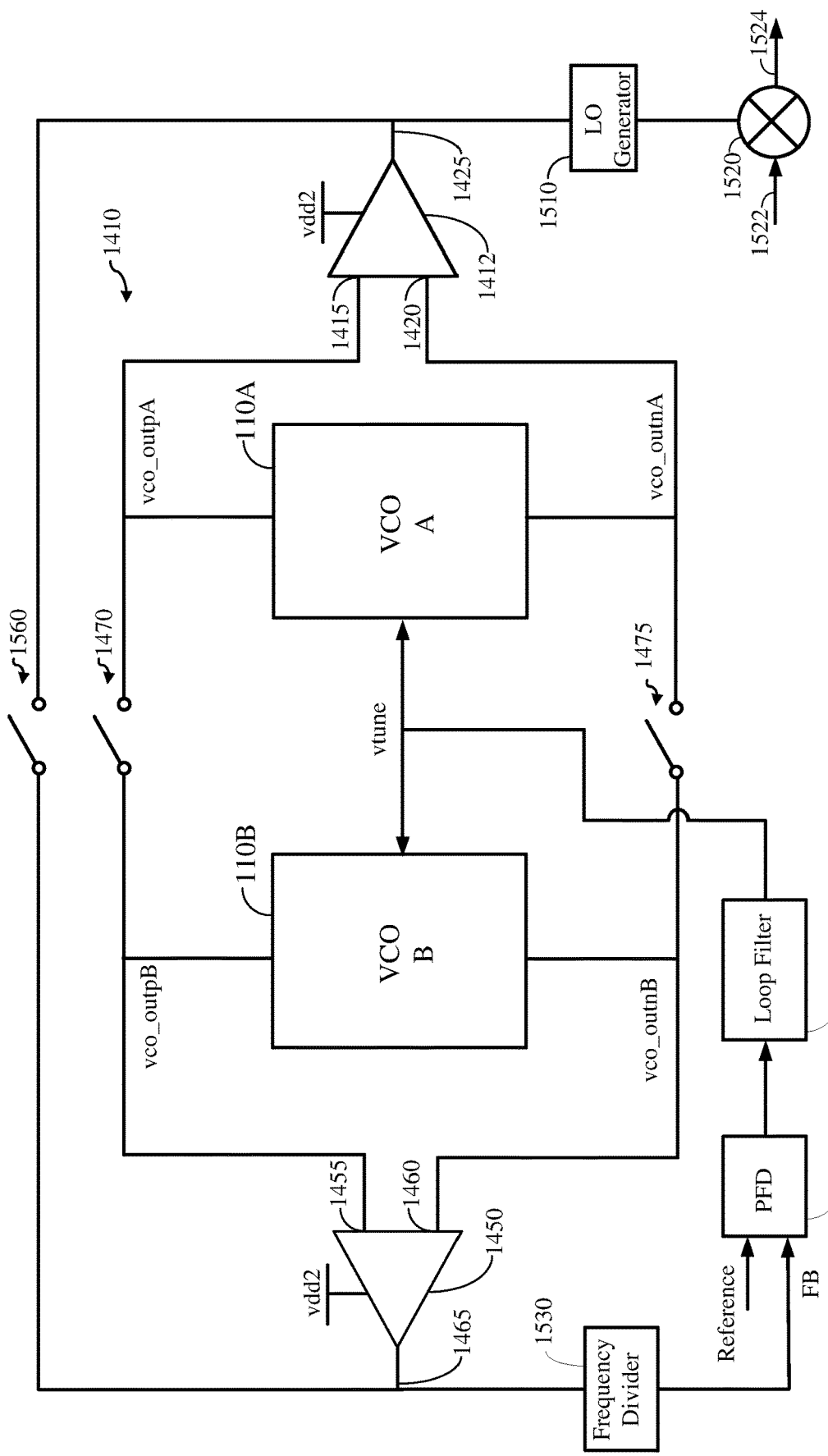
FIG. 15 shows an example in which the exemplary dual-core VCO in FIG. 14 is coupled to a local oscillator (LO) generator and a frequency divider according to certain aspects of the present disclosure.

FIG. 15 shows an example in which the output 1425 of the first buffer 1412 is coupled to the LO generator 1510. In this example, the LO generator 1510 converts the output signal of the first buffer 1412 into the LO signal, which may be distributed to mixers. The mixers may use the LO signal for performing frequency downconversion in a receiver and/or performing frequency upconversion in a transmitter. FIG. 15 shows an example of one of the mixers 1520 coupled to the output of the LO generator 1510. The mixer 1520 may mix the LO signal with an input signal 1522 to generate an output signal 1524. In one example, the input signal 1522 is a baseband signal or an intermediate-frequency signal and the output signal 1524 is a radio frequency (RF) signal. In this example, the mixer 1520 mixes the LO signal with the input signal 1522 to upconvert the frequency of the input signal 1522 to RF. In another example, the input signal 1522 is an RF signal and the output signal 1524 is an intermediate-frequency signal or a baseband signal. In this example, the mixer 1520 mixes the LO signal with the input signal 1522 to downconvert the frequency of the input signal 1522 to an intermediate frequency or baseband. The LO generator 1510 may convert the output signal of the first buffer 1412 into the LO signal by translating the frequency of the output signal to a desired LO frequency and amplifying the output signal. In this example, the first buffer 1412 drives the LO generator 1510 with the combined signal of the first and second VCOs 110A and 110B in the dual-core mode and drives the LO generator 1510 with the output signal of the first VCO 110A in the single-core mode.

The output of the second buffer 1450 is coupled to the frequency divider 1530 of the PLL. The PLL includes a phase frequency detector (PFD) 1540, and a loop filter 1550 (e.g., a low-pass filter). In operation, the frequency divider 1530 divides the frequency of the output signal of the second buffer 1450 to generate a feedback signal (labeled "FB"), which is input to the PFD 1540. The frequency divider 1530 is in the feedback loop of the PLL.

The PFD 1540 compares the feedback signal with the reference signal, and generates a phase error signal based on the comparison. The phase error signal is input to the loop filter 1550, which filters the phase error signal to generate the tuning voltage vtune for the first and second VCOs 110A and 110B based on the phase error signal. The tuning voltage vtune is input to the varactors 220A and 220B (shown in FIG. 13) of the first and second VCOs 110A and 110B, respectively, to control the oscillation frequencies of the first and second VCOs 110A and 110B. Note that the first and second VCOs 110A and 110B are part of the PLL in this example. When the PLL is locked, the oscillation frequencies of the first and second VCOs 110A and 110B are approximately equal to the frequency of the reference signal multiplied by a multiplier (which may be the inverse of the divider value of the frequency divider 1530).

In this example, the second buffer 1450 drives the frequency divider 1530 with the combined signal of the first and second VCOs 110A and 110B in the dual-core mode.

In the single-core mode, the first buffer 1412 drives the frequency divider 1530 with the output signal of the first VCO 110A. In this regard, a switch 1560 may be coupled between the output 1425 of the first buffer 1412 and the frequency divider 1530. In the dual-core mode, the switch 1560 is open and the second buffer 1450 drives the frequency divider 1530. In the single-core mode, the switch 1560 is closed. In this case, the output 1425 of the first buffer 1412 is coupled to the frequency driver 1530, and the first buffer 1412 drives both the frequency divider 1530 and the LO generator 1510.

Figure 16:
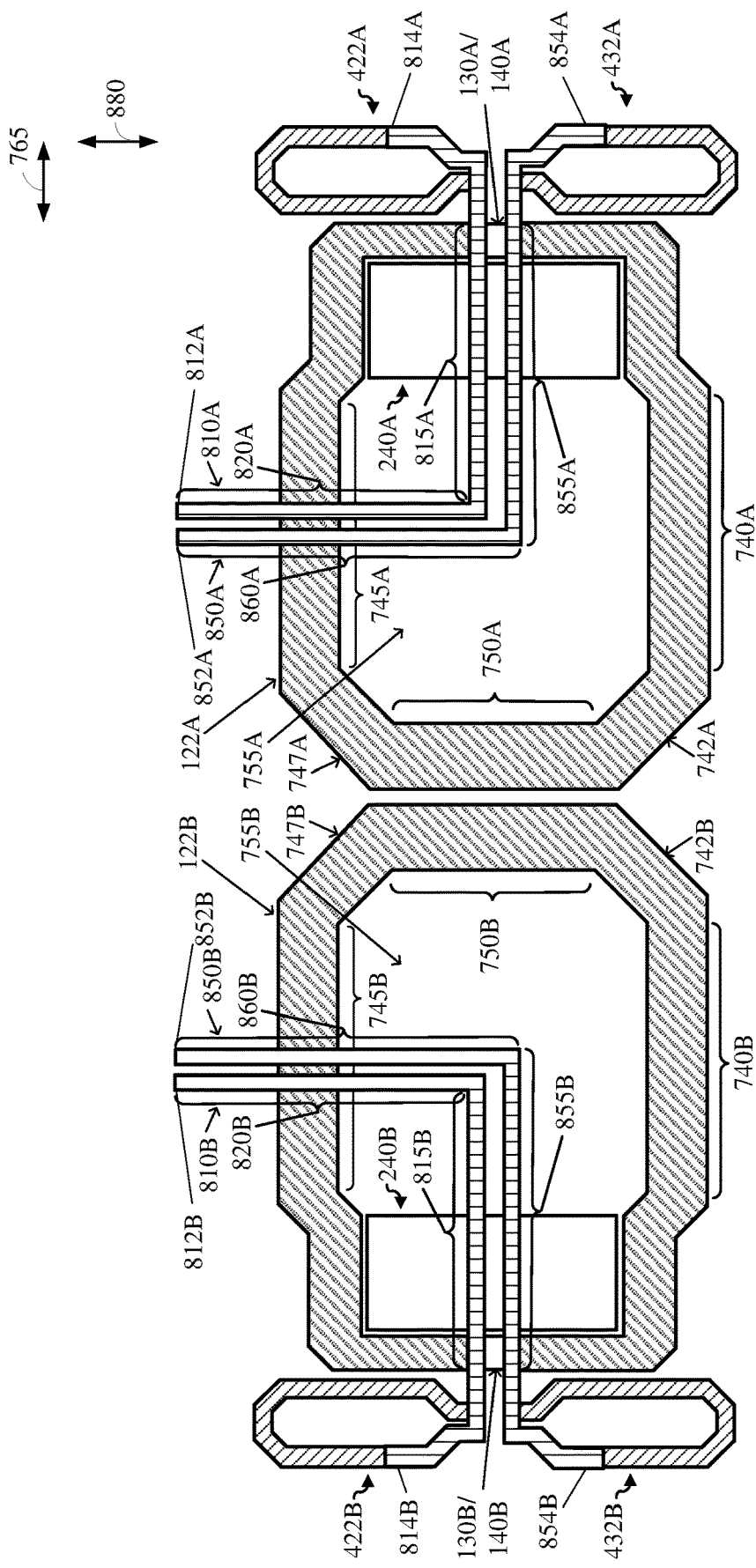
FIG. 16 shows a top view of an example of a chip layout for a first VCO and a second VCO according to certain aspects of the present disclosure.

FIG. 16 shows a top view of an exemplary chip layout for the first VCO 110A and the second VCO 110B according to certain aspects of the present disclosure. The layout may be used for the exemplary dual-core VCO 1210 shown in FIG. 12, the exemplary dual-core VCO 1410 shown in FIG. 14, or another dual-core VCO including the first and second VCOs 110A and 110B. To distinguish between the components of the first and second VCOs 110A and 110B in FIG. 16, the letter "A" is appended to the reference numbers for the components of the first VCO 110A and the letter "B" is appended to the reference numbers for the components of the second VCO 110B.

In the example shown in FIG. 16, the first VCO 110A is laid out in a similar manner as the VCO 110 shown in FIG. 7A. FIG. 16 shows the layout for the resonant inductor 122A, the capacitor bank 240A, the impedance inductors 422A and 432A, and the active circuits 130A and 140A of the first VCO 110A. In this example, the resonant inductor 122A is a planar inductor integrated on the chip (i.e., die), and the impedance inductors 422A and 432A are planar inductors (e.g., planar loop inductors) integrated on the chip. The impedance inductors 422A and 432A may be formed from a different metal layer than the resonant inductor 122A to reduce magnetic coupling between the resonant inductor 122A and the impedance inductors 422A and 432A, as discussed above with reference to FIG. 7B.

The resonant inductor 122A includes a first elongated portion 740A, a second elongated portion 745A, and a third elongated portion 750A. The first and second elongated portions 740A and 745A run parallel to each other, and are both perpendicular to the third elongated portion 750A. The resonant inductor 122A also includes a first angled portion 742A (i.e., turn) coupling the third elongated portion 750A to the first elongated portion 740A, and a second angled portion 747A (i.e., turn) coupling the third elongated portion 750A to the second elongated portion 745A. The resonant inductor 122A may be a continuous metal trace in the form (i.e., shape) of a loop, in which case the inductor portions 740A, 742A, 745A, 747A and 750A are contiguous.

In the example in FIG. 16, most of the magnetic flux of the resonant inductor 122A is confined to an area 755A bounded by the first, second and third elongated portions 740A, 745A and 750A of the resonant inductor 122A and the left-most edge of the capacitor bank 240A. This area 755A is referred to as the main magnetic flux area 755A below.

FIG. 16 also shows an example of voltage supply routing and ground routing for the first VCO 110A. In this example, the voltage supply routing includes a voltage supply metal line 810A (referred to as simply supply line below) configured to route the supply voltage (e.g., vdd1) to the first VCO 110A. The supply line 810A has a first end 812A and a second end 814A. The first end 812A of the supply line 810A is located above the resonant inductor 122A in lateral direction 880 (indicated by a double arrow in FIG. 16). The first end 812A may be coupled to a voltage regulator (e.g., the first voltage regulator 1250) located above the resonant inductor 122A in lateral direction 880. The second end 814A of the supply line 810A is coupled to the impedance inductor 422A of the first resonant impedance circuit 420A (e.g., by one or more vias).

In this example, the ground routing includes a ground metal line 850A (referred to as simply ground line below) configured to couple the first VCO 110A to ground. The ground line 850A has a first end 852A and a second end 854A. The first end 852A of the ground line 850A is located above the resonant inductor 122A in lateral direction 880. The first end 852A may be coupled to a ground rail located above the resonant inductor 122A in lateral direction 880. The second end 854A of the ground line 850A is coupled to the impedance inductor 432A of the second resonant impedance circuit 430A (e.g., by one or more vias).

In the example shown in FIG. 16, the supply line 810A and the ground line 850A run parallel to each other with a small gap separating the two lines. Each of the supply line 810A and the ground line 850A may be a respective continuous metal trace formed from a metal layer on the die that is higher than the metal layer used to form the resonant inductor 122A. This allows the supply line 810A and the ground line 850A to be routed over the resonant inductor 122A.

In the example in FIG. 16, the supply line 810A includes a first portion 815A and a second portion 820A, in which the first and second portions 815A and 820A are orientated approximately perpendicular to each other. The first portion 815A of the supply line 810A runs approximately parallel with the first and second elongated portions 740A and 745A of the resonant inductor 122A. The first portion 815A of the supply line 810A is located between the first and second elongated portions 740A and 745A of the resonant inductor 122A. In certain aspects, the first portion 815A of the supply line 810A is placed approximately equidistant from the first and second elongated portions 740A and 745A of the resonant inductor 122A. As discussed above, placing the first portion 815A of the supply line 810A approximately equidistant from the first and second elongated portions 740A and 745A of the resonant inductor 122A reduces phase noise.

The second portion 820A of the supply line 810A is oriented approximately perpendicular to the first and second elongated portions 740A and 745A of the resonant inductor 122A. The second portion 820A of the supply line 810A extends upward from the first portion 815A of the supply line 810A in lateral direction 880, and passes over the second elongated portion 745A of the resonant inductor 122A. Thus, the second portion 820A of the supply line 810A facilitates supply routing to a voltage regulator (e.g., the first voltage regulator 1250) or another structure located above the resonant inductor 122A in lateral direction 880.

The ground line 850A includes a first portion 855A and a second portion 860A, in which the first and second portions 855A and 860A are orientated approximately perpendicular to each other. The first portion 855A of the ground line 850A runs approximately parallel with the first and second elongated portions 740A and 745A of the resonant inductor 122A. The first portion 855A of the ground line 850A is located between the first and second elongated portions 740A and 745A of the resonant inductor 122A. In certain aspects, the first portion 855A of the ground line 850A is placed approximately equidistant from the first and second elongated portions 740A and 745A of the resonant inductor 122A. As discussed above, placing the first portion 855A of the ground line 850A approximately equidistant from the first and second elongated portions 740A and 745A of the resonant inductor 122A reduces phase noise.

The second portion 860A of the ground line 850A is oriented approximately perpendicular to the first and second elongated portions 740A and 745A of the resonant inductor 122A. The second portion 860A of the ground line 850A extends upward from the first portion 855A of the ground line 850A in lateral direction 880, and passes over the second elongated portion 745A of the resonant inductor 122A. Thus, the second portion 860A of the ground line 850A facilitates ground routing to a structure (e.g., ground rail) located above the resonant inductor 122A in lateral direction 880.

In the example shown in FIG. 16, the second VCO 110B is placed next to the first VCO 110A on the die. The layout of the second VCO 110B corresponds to the layout of the first VCO 110A flipped horizontally in lateral direction 765, as shown in FIG. 16. As a result, the resonant inductor 122B of the second VCO 110B is located to the right of the respective impedance inductors 422B and 432B while the resonant inductor 122A of the first VCO 110A is located to the left of the respective impedance inductors 422A and 432A in FIG. 16. This layout allows the resonant inductor 122A of the first VCO 110A to be placed adjacent to the resonant inductor 122B of the second VCO 110B, as shown in FIG. 16. The close proximity of the resonant inductors 122A and 122B of the first and second VCOs 110A and 110B increases the quality factor of the resonant inductors 122A and 122B. This is because the close proximity of the resonant inductors 122A and 122B facilitates the flow of magnetic flux between the resonant inductors 122A and 122B, which boosts the magnetic flux of each resonant inductor 122A and 122B and increases the quality factor. The increased quality factor translates into reduced phase noise for a given power.

FIG. 16 shows the layout for the resonant inductor 122B, the capacitor bank 240B, the impedance inductors 422B and 432B, and the active circuits 130B and 140B of the second VCO 110B. In this example, the resonant inductor 122B is a planar inductor integrated on the chip (i.e., die), and the impedance inductors 422B and 432B are planar inductors (e.g., planar loop inductors) integrated on the chip (i.e., die).

The resonant inductor 122B includes a first elongated portion 740B, a second elongated portion 745B, and a third elongated portion 750B. The first and second elongated portions 740B and 745B run parallel to each other, and are both perpendicular to the third elongated portion 750B. The resonant inductor 122B also includes a first angled portion 742B (i.e., turn) coupling the third elongated portion 750B to the first elongated portion 740B, and a second angled portion 747B (i.e., turn) coupling the third elongated portion 750B to the second elongated portion 745B. The resonant inductor 122B may be a continuous metal trace in the form (i.e., shape) of a loop, in which case the inductor portions 740B, 742B, 745B, 747B and 750B are contiguous.

In the example in FIG. 16, most of the magnetic flux of the resonant inductor 122B is confined to an area 755B bounded by the first, second and third elongated portions 740B, 745B and 750B of the resonant inductor 122B and the right-most edge of the capacitor bank 240B. This area 755B is referred to as the main magnetic flux area 755B below.

FIG. 16 also shows an example of voltage supply routing and ground routing for the second VCO 110B. In this example, the voltage supply routing includes a voltage supply metal line 810B (referred to as simply supply line below) configured to route the supply voltage (e.g., vdd1) to the second VCO 110B. The supply line 810B has a first end 812B and a second end 814B. The first end 812B of the supply line 810B is located above the resonant inductor 122B in lateral direction 880. The first end 812B may be coupled to a voltage regulator (e.g., the first voltage regulator 1250) located above the resonant inductor 122B in lateral direction 880. The second end 814B of the supply line 810B is coupled to the impedance inductor 422B of the first resonant impedance circuit 420B (e.g., by one or more vias).

In this example, the ground routing includes a ground metal line 850B (referred to as simply ground line below) configured to couple the second VCO 110B to ground. The ground line 850B has a first end 852B and a second end 854B. The first end 852B of the ground line 850B is located above the resonant inductor 122B in lateral direction 880. The first end 852B may be coupled to a ground rail located above the resonant inductor 122B in lateral direction 880. The second end 854B of the ground line 850B is coupled to the impedance inductor 432B of the second resonant impedance circuit 430B (e.g., by one or more vias).

In the example shown in FIG. 16, the supply line 810B and the ground line 850B run parallel to each other with a small gap separating the two lines. Each of the supply line 810B and the ground line 850B may be a respective continuous metal trace formed from a metal layer on the die that is higher than the metal layer used to form the resonant inductor 122B. This allows the supply line 810B and the ground line 850B to be routed over the resonant inductor 122B.

In the example in FIG. 16, the supply line 810B includes a first portion 815B and a second portion 820B, in which the first and second portions 815B and 820B are orientated approximately perpendicular to each other. The first portion 815B of the supply line 810B runs approximately parallel with the first and second elongated portions 740B and 745B of the resonant inductor 122B. The first portion 815B of the supply line 810B is located between the first and second elongated portions 740B and 745B of the resonant inductor 122B. In certain aspects, the first portion 815B of the supply line 810B is placed approximately equidistant from the first and second elongated portions 740B and 745B of the resonant inductor 122B.

The second portion 820B of the supply line 810B is oriented approximately perpendicular to the first and second elongated portions 740B and 745B of the resonant inductor 122B. The second portion 820B of the supply line 810B extends upward from the first portion 815B of the supply line 810B in lateral direction 880, and passes over the second elongated portion 745B of the resonant inductor 122B.

The ground line 850B includes a first portion 855B and a second portion 860B, in which the first and second portions 855B and 860B are orientated approximately perpendicular to each other. The first portion 855B of the ground line 850B runs approximately parallel with the first and second elongated portions 740B and 745B of the resonant inductor 122B. The first portion 855B of the ground line 850B is located between the first and second elongated portions 740B and 745B of the resonant inductor 122B. In certain aspects, the first portion 855B of the ground line 850B is placed approximately equidistant from the first and second elongated portions 740B and 745B of the resonant inductor 122B.

The second portion 860B of the ground line 850B is oriented approximately perpendicular to the first and second elongated portions 740B and 745B of the resonant inductor 122B. The second portion 860B of the ground line 850B extends upward from the first portion 855B of the ground line 850B in lateral direction 880, and passes over the second elongated portion 745B of the resonant inductor 122B. Thus, the second portion 860B of the ground line 850B facilitates ground routing to a structure (e.g., ground rail) located above the resonant inductor 122B in lateral direction 880.

As discussed above, the resonant inductors 122A and 122B of the first and second VCOs 110A and 110B are adjacent to each other on the die, which increases the quality factor of the inductors 122A and 122B. In the example shown in FIG. 16, the layout of the second VCO 110B is flipped horizontally with respect to the layout of the first VCO 110A. This facilitates placement of the resonant inductor 122A of the first VCO 110A in close proximity to the resonant inductor 122B of the second VCO 110B.

In the example shown in FIG. 16, the third elongated portion 750A of the resonant inductor 122A of the first VCO 110A is adjacent to the third elongated portion 750B of the resonant inductor 122B of the second VCO 110B. Also, the third elongated portion 750A of the resonant inductor 122A is parallel with the third elongated portion 750B of the resonant inductor 122B. The resonant inductors 122A and 122B are between the impedance inductors 422A and 432A of the first VCO 110A and the impedance inductors 422B and 432B of the second VCO 110B. In certain aspects, one of the impedance inductors 422A and 432A may be omitted from the first VCO 110A and one of the impedance inductors 422B and 432B may be omitted from the second VCO 110B. In these aspects, the resonant inductors 122A and 122B are between the impedance inductor (either 422A or 432A) of the first VCO 110A and the impedance inductor (either 422B or 432B) of the second VCO 110B.

As shown in FIG. 16, the supply lines 810A and 810B of the first and second VCOs 110A and 110B bend upward, which facilitates supply routing to a voltage regulator (e.g., the first voltage regulator 1250) or other structure located above the first and second VCOs 110A and 110B. The bend of each supply line 810A and 810B is located within the respective resonant inductor 122A and 122B (e.g., approximately the center of the respective main magnetic flux area 755A and 755B). This feature facilitates placement of the resonant inductor 122A of the first VCO 110A in close proximity to the resonant inductor 122B of the second VCO 110B. For example, if the bends were located between the resonant inductors 122A and 122B, then a space would be needed between the resonant inductors 122A and 122B for routing the supply lines 810A and 810B upward. Such a space between the resonant inductors 122A and 122B would reduce the flow of magnetic flux between the resonant inductors 122A and 122B, and thus the reduce quality factor of the resonant inductors 122A and 122B.

The ground lines 850A and 850B of the first and second VCOs 110A and 110B also bend upward. In the example shown in FIG. 16, the bend of each ground line 850A and 850B is located within the respective resonant inductor 122A and 122B (e.g., approximately the center of the respective main magnetic flux area 755A and 755B).

Figure 17:
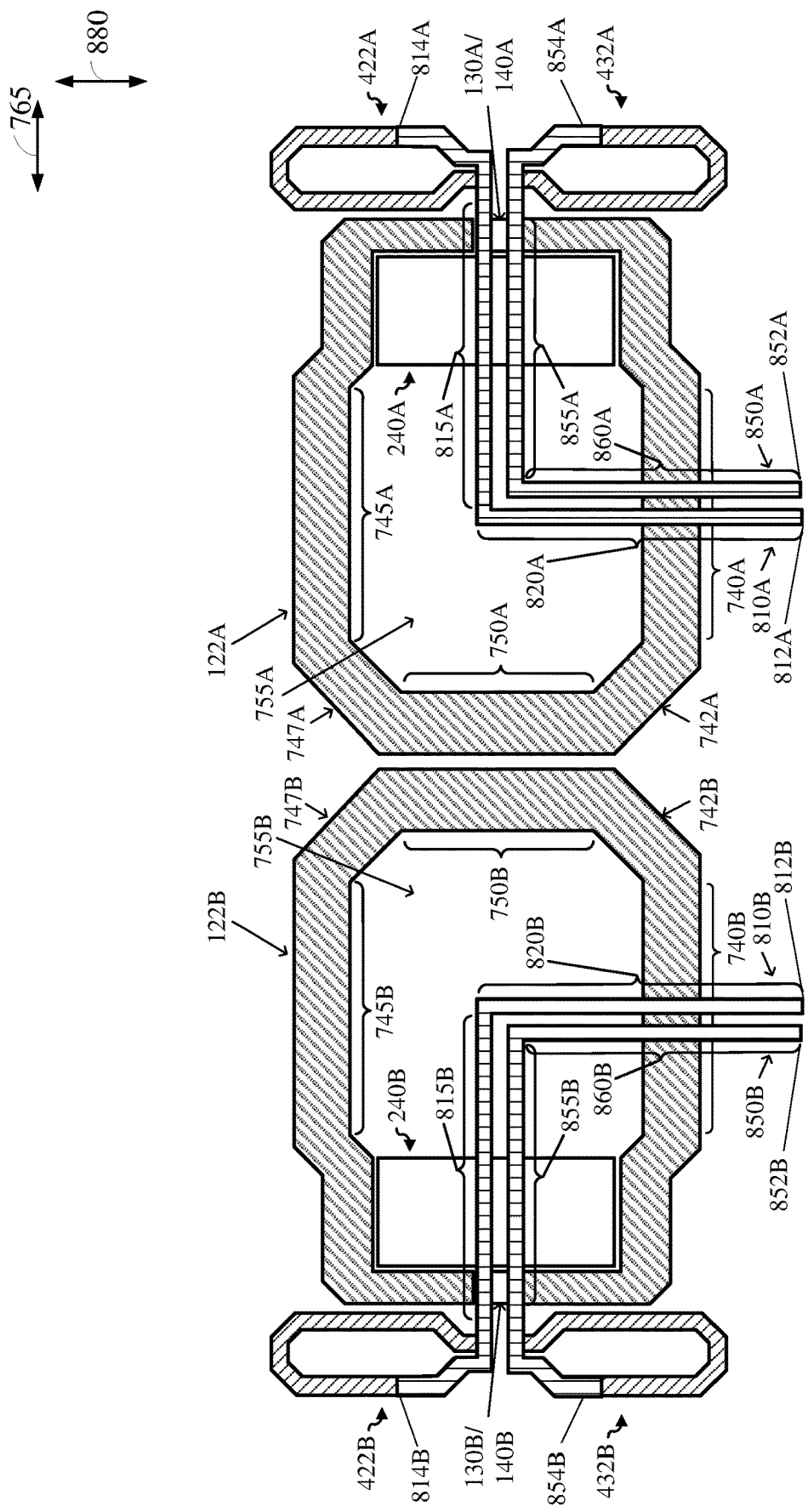
FIG. 17 shows a top view of another example of a chip layout for a first VCO and a second VCO according to certain aspects of the present disclosure.

Although the supply lines 810A and 810B and the ground lines 850A and 850B bend upwards in the example shown in FIG. 16, it is to be appreciated that the present disclosure is not limited to this example. In this regard, FIG. 17 shows an example in which the supply lines 810A and 810B bend downward, which facilitates supply routing to a voltage regulator (e.g., the first voltage regulator 1250) or other structure located below the first and second VCOs 110A and 110B. In this example, the bend of each supply line 810A and 810B is located within the respective resonant inductor 122A and 122B (e.g., approximately the center of the respective main magnetic flux area 755A and 755B).

In the example shown in FIG. 17, the ground line 850A and 850B also bend downward, which facilitates ground routing to a ground rail or other structure located below the first and second VCOs 110A and 110B. Also, the bend of each ground line 850A and 850B is located within the respective resonant inductor 122A and 122B (e.g., approximately the center of the respective main magnetic flux area 755A and 755B).

Figure 18A:
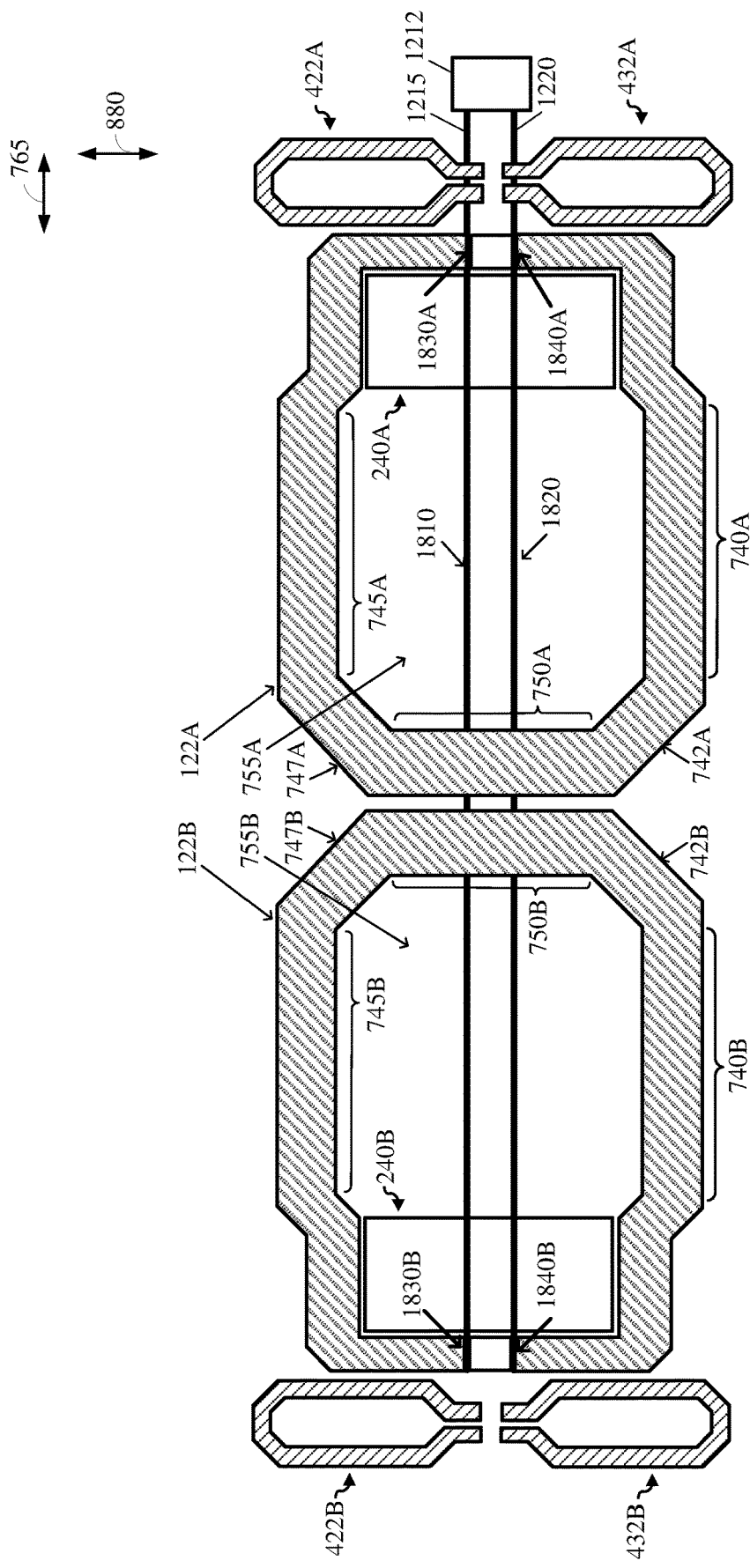
FIG. 18A shows a top view of an example of output signal routing for a dual-core VCO according to certain aspects of the present disclosure.

FIG. 18A shows an example of output signal routing for the dual-core VCO 1210 according to certain aspects. In this example, the output signal routing includes a first output signal line 1810 and a second output signal line 1820. Each of the first and second output signal lines 1810 and 1820 may be formed from a metal layer on the die that is lower than the metal layer used to form the resonant inductors 122A and 122B. This allows each of the output signal lines 1810 and 1820 to be routed under the resonant inductors 122A and 122B. In the example shown in FIG. 18A, each of the first and second output signal lines 1810 and 1820 passes under the third elongated portions 750A and 750B of the resonant inductors 122A and 122B. Note that the supply lines 810A and 810B and the ground lines 850A and 850B are not shown in FIG. 18A. In another example, each of the first and second output signal lines 1810 and 1820 may be formed from a metal layer on the die that is higher than the metal layer used to form the resonant inductors 122A and 122B. In this example, each of the output signal lines 1810 and 1820 may be routed over the resonant inductors 122A and 122B.

The first output signal line 1810 is coupled to a first end 1830A of the resonant inductor 122A of the first VCO 110A (e.g., by one or more vias). The first output signal line 1810 is also coupled to a first end 1830B of the resonant inductor 122B of the second VCO 110B (e.g., by one or more vias). In this example, the first output vco_outpA of the first VCO 110A is taken at the first end 1830A of the resonant inductor 122A and the first output vco_outpB of the second VCO 110B is taken at the first end 1830B of the resonant inductor 122B. Thus, in this example, the first output signal line 1810 is coupled to both the first output vco_outpA of the first VCO 110A and the first output vco_outpB of the second VCO 110B. The first output signal line 1810 extends in lateral direction 765 between the first end 1830B of the resonant inductor 122B and the first end 1830A of the resonant inductor 122A.

The first output signal line 1810 is also coupled to the first input 1215 of the buffer 1212. In the example in FIG. 18A, the buffer 1212 is located to the right of the first VCO 110A, and the first output signal line 1810 extends from the first end 1830A of the resonant inductor 122A to the first input 1215 of the buffer 1212. Since the first output signal line 1810 is coupled to both the first output vco_outpA of the first VCO 110A and the first output vco_outpB of the second VCO 110B, the first output signal line 1810 combines the output signal from the first output vco_outpA of the first VCO 110A and the output signal from the first output vco_outpB of the second VCO 110B into a combined signal, and inputs the combined signal to the first input 1215 of the buffer 1212.

The second output signal line 1820 is coupled to a second end 1840A of the resonant inductor 122A of the first VCO 110A (e.g., by one or more vias). The second output signal line 1820 is also coupled to a second end 1840B of the resonant inductor 122B of the second VCO 110B (e.g., by one or more vias). In this example, the second output vco_outnA of the first VCO 110A is taken at the second end 1840A of the resonant inductor 122A and the second output vco_outnB of the second VCO 110B is taken at the second end 1840B of the resonant inductor 122B. Thus, in this example, the second output signal line 1820 is coupled to both the second output vco_outnA of the first VCO 110A and the second output vco_outnB of the second VCO 110B. The second output signal line 1820 extends in lateral direction 765 between the second end 1840B of the resonant inductor 122B and the second end 1840A of the resonant inductor 122A.

The second output signal line 1820 is also coupled to the second input 1220 of the buffer 1212. In the example in FIG. 18A, the second output signal line 1820 extends from the second end 1840A of the resonant inductor 122A to the second input 1220 of the buffer 1212. Since the second output signal line 1820 is coupled to both the second output vco_outnA of the first VCO 110A and the second output vco_outnB of the second VCO 110B, the second output signal line 1820 combines the output signal from the second output vco_outnA of the first VCO 110A and the output signal from the second output vco_outnB of the second VCO 110B into a combined signal, and inputs the combined signal to the second input 1220 of the buffer 1212.

Figure 18B:
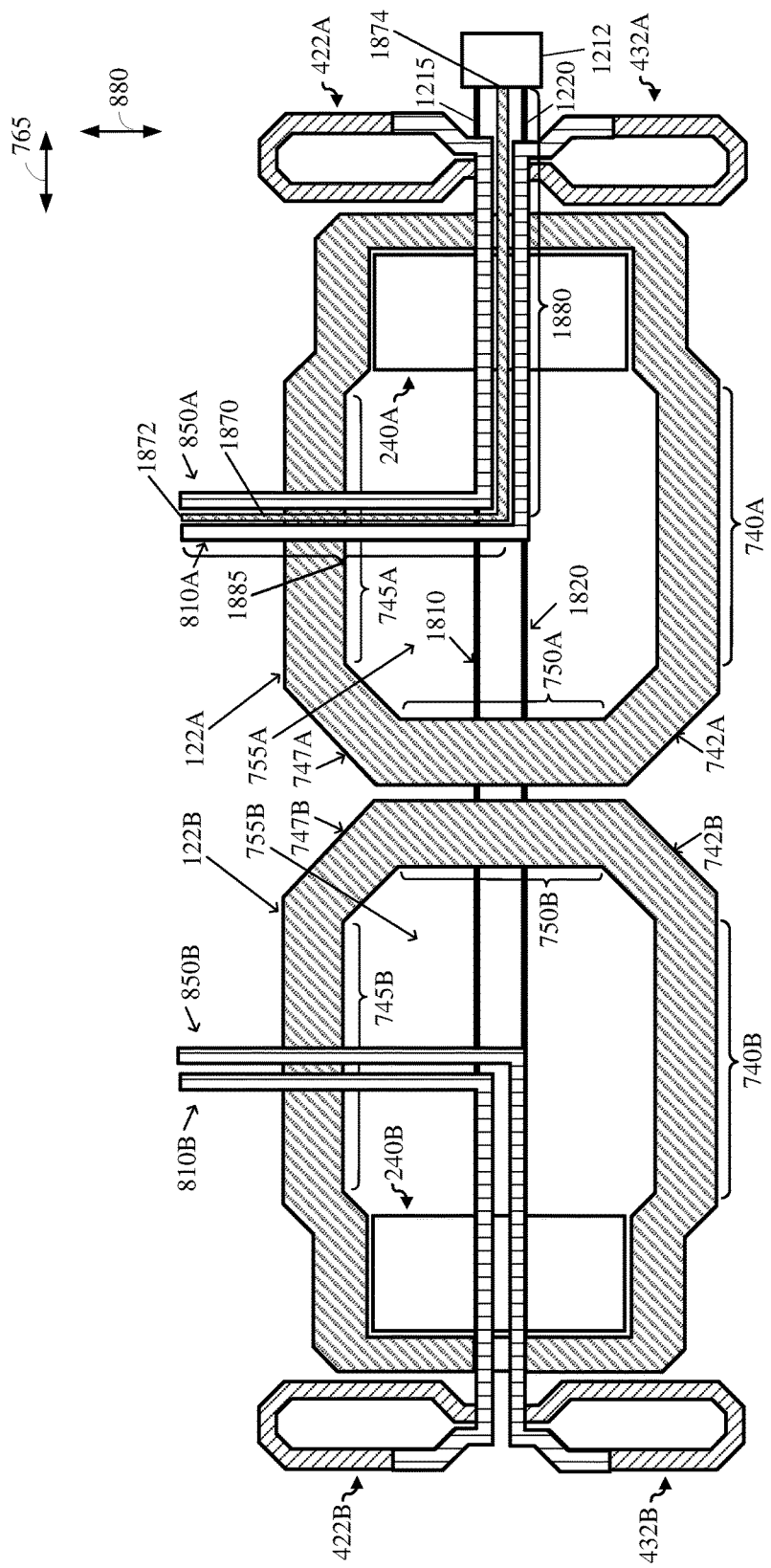
FIG. 18B shows a top view of an example of voltage supply routing for a buffer according to certain aspects of the present disclosure.

FIG. 18B shows an example of voltage supply routing for the buffer 1212 according to certain aspects of the present disclosure. In this example, the voltage supply routing for the buffer 1212 includes a voltage supply metal line 1870 (referred to as simply supply line below) configured to route the second supply voltage vdd2 (e.g., from the second voltage regulator 1260) to the buffer 1212. In this example, the supply line 1870 for the buffer 1212 is placed between the supply line 810A and the ground line 850A for the first VCO 110A and runs parallel with the supply line 810A and the ground line 850A. The supply line 1870 has a first end 1872 and a second end 1874. The first end 1872 of the supply line 1870 is located above the resonant inductor 122A in lateral direction 880. The first end 1872 may be coupled to a voltage regulator (e.g., the second voltage regulator 1260) located above the resonant inductor 122A in lateral direction 880. The second end 1874 of the supply line 1870 is coupled to the supply input of the buffer 1212. In this example, the buffer 1212 may be coupled to ground via the ground line 850A.

The supply line 1870 includes a first portion 1880 and a second portion 1885, in which the first and second portions 1880 and 1885 are orientated approximately perpendicular to each other. The first portion 1880 of the supply line 1870 runs approximately parallel with the first and second elongated portions 740A and 745A of the resonant inductor 122A, and is located between the first and second elongated portions 740A and 745A of the resonant inductor 122A. In the example in FIG. 18B, the first portion 1880 of the supply line 1870 is placed approximately equidistant from the first and second elongated portions 740A and 745A of the resonant inductor 122A. This reduces phase noise at the buffer 1212 by providing approximately equal inductive coupling between the first portion 1880 of the supply line 1870 and each of the first and second elongated portions 740A and 745A of the resonant inductor 122A.

The second portion 1885 of the supply line 1870 is oriented approximately perpendicular to the first and second elongated portions 740A and 745A of the resonant inductor 122A. The second portion 1885 of the supply line 1870 extends upward from the first portion 1885 of the supply line 1870 in lateral direction 880, and passes over the second elongated portion 745A of the resonant inductor 122A. Thus, the second portion 1885 of the supply line 1870 facilitates supply routing to a voltage regulator (e.g., the second voltage regulator 1260) or another structure located above the resonant inductor 122A in lateral direction 880

FIG. 19A shows an example of output signal routing for the dual-core VCO 1410 according to certain aspects. In this example, the output signal routing includes first, second, third and fourth output signal lines 1910, 1915, 1920 and 1925. FIG. 19B shows an unobstructed view of the first, second, third and fourth output signal lines 1910, 1915, 1920 and 1925. Each of the output signal lines 1910, 1915, 1920 and 1925 may be formed from a metal layer on the die that is lower than the metal layer used to form the resonant inductors 122A and 122B. Note that the supply lines 810A and 810B and the ground lines 850A and 850B are not shown in FIG. 19A.

The first output signal line 1910 is coupled to the first end 1830A of the resonant inductor 122A of the first VCO 110A (e.g., by one or more vias). The first output signal line 1910 is also coupled to the first input 1415 of the first buffer 1412, which may be located to the right of the resonant inductor 122A. In this example, the first output vco_outpA of the first VCO 110A is taken at the first end 1830A of the resonant inductor 122A. Thus, in this example, the first output signal line 1910 couples the first output vco_outpA of the first VCO 110A to the first input 1415 of the first buffer 1412.

The second output signal line 1915 is coupled to the first end 1830B of the resonant inductor 122B of the second VCO 110B (e.g., by one or more vias). The second output signal line 1915 is also coupled to the first input 1455 of the second buffer 1450, which may be located to the left of the resonant inductor 122B. In this example, the first output vco_outpB of the second VCO 110B is taken at the first end 1830B of the resonant inductor 122B. Thus, in this example, the second output signal line 1915 couples the first output vco_outpB of the second VCO 110B to the first input 1455 of the second buffer 1450.

In this example, the first switch 1470 is coupled between the first output signal line 1910 and the second output signal line 1915. When the first switch 1470 is closed in the dual-core mode, the first switch 1470 couples the first output signal line 1910 to the second output signal line 1915. In this case, the first output vco_outpA of the first VCO 110A and the first output vco_outpB of the second VCO 110B are both coupled to the first input 1415 of the first buffer 1412 and the first input 1455 of the second buffer 1450. When the first switch 1740 is open in the single-core mode, the first output signal line 1910 is decoupled from the second output signal line 1915. In the example shown in FIG. 19A, the first switch 1470 is centrally located in the dual-core VCO 1410 under the resonant inductors 122A and 122B. FIG. 19B shows an unobstructed view of the first switch 1470.

The third output signal line 1920 is coupled to the second end 1840A of the resonant inductor 122A of the first VCO 110A (e.g., by one or more vias). The third output signal line 1920 is also coupled to the second input 1420 of the first buffer 1412. In this example, the second output vco_outnA of the first VCO 110A is taken at the second end 1840A of the resonant inductor 122A. Thus, in this example, the third output signal line 1920 couples the second output vco_outnA of the first VCO 110A to the second input 1420 of the first buffer 1412.

The fourth output signal line 1925 is coupled to the second end 1840B of the resonant inductor 122B of the second VCO 110B (e.g., by one or more vias). The fourth output signal line 1925 is also coupled to the second input 1460 of the second buffer 1450. In this example, the second output vco_outnB of the second VCO 110B is taken at the second end 1840B of the resonant inductor 122B. Thus, in this example, the fourth output signal line 1925 couples the second output vco_outnB of the second VCO 110B to the second input 1460 of the second buffer 1450.

In this example, the second switch 1475 is coupled between the third output signal line 1920 and the fourth output signal line 1925. When the second switch 1475 is closed in the dual-core mode, the second switch 1475 couples the third output signal line 1920 to the fourth output signal line 1925. In this case, the second output vco_outnA of the first VCO 110A and the second output vco_outnB of the second VCO 110B are both coupled to the second input 1420 of the first buffer 1412 and the second input 1460 of the second buffer 1450. When the second switch 1745 is open in the single-core mode, the third output signal line 1920 is decoupled from the fourth output signal line 1925. In the example shown in FIG. 19A, the second switch 1475 is centrally located in the dual-core VCO 1410 under the resonant inductors 122A and 122B. FIG. 19B shows an unobstructed view of the second switch 1475.

Figure 19C:
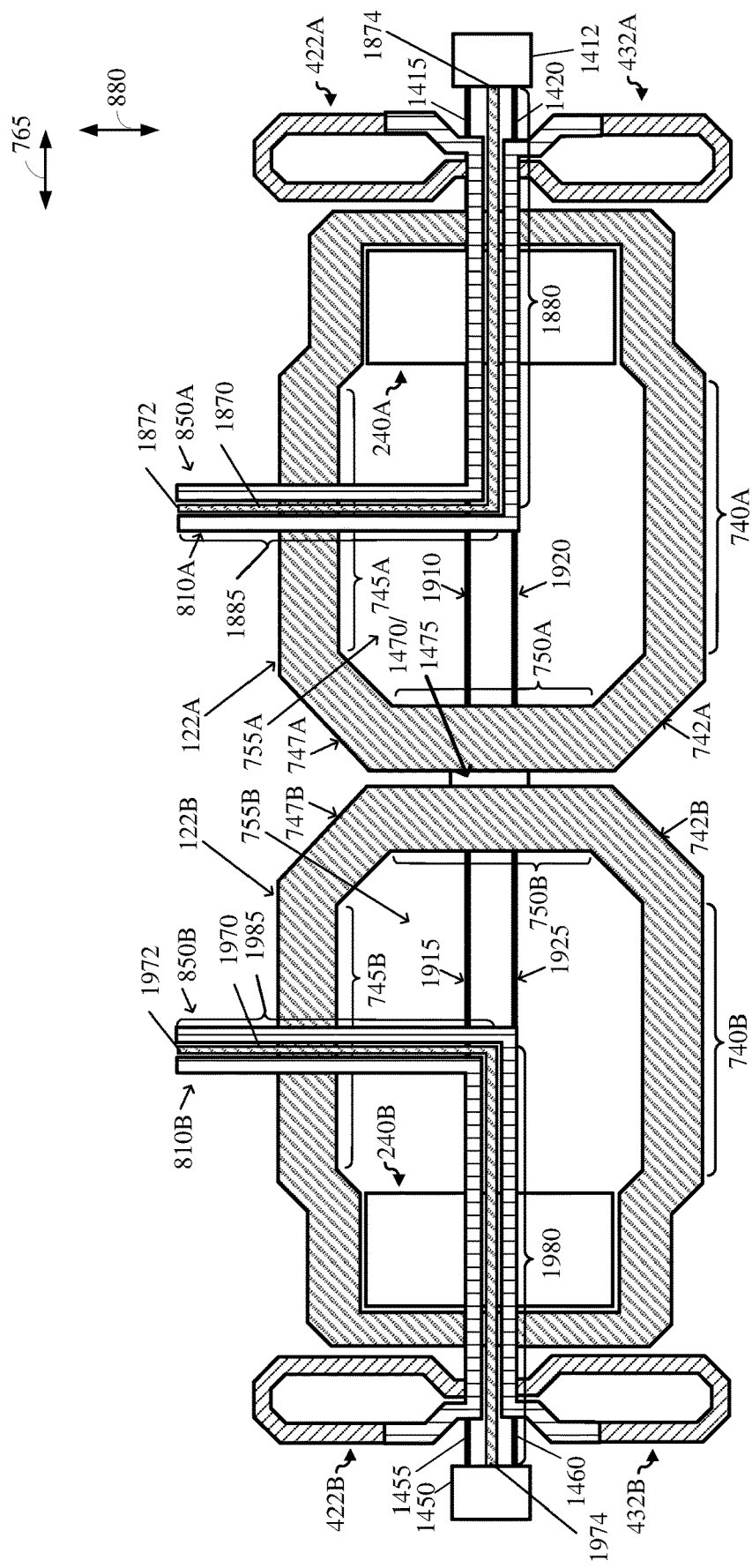
FIG. 19C shows a top view of an example of voltage supply routing for a first buffer and a second buffer according to certain aspects of the present disclosure.

FIG. 19C shows an example of voltage supply routing for the first and second buffers 1412 and 1450 according to certain aspects of the present disclosure. In this example, the voltage supply routing for the first buffer 1412 includes the supply line 1870 discussed above with reference with FIG. 18B. In this example, the second end 1874 of the supply line 1870 is coupled to the first buffer 1412. Since the supply line 1870 is described above with reference to FIG. 18B, a description of the supply line 1870 is not repeated here for brevity.

The voltage supply routing for the second buffer 1450 includes a voltage supply metal line 1970 (referred to as simply supply line below) configured to route the second supply voltage vdd2 (e.g., from the second voltage regulator 1260) to the second buffer 1450. In this example, the supply line 1970 for the second buffer 1460 is placed between the supply line 810B and the ground line 850B for the second VCO 110B and runs parallel with the supply line 810B and the ground line 850B. The supply line 1970 has a first end 1972 and a second end 1974. The first end 1972 of the supply line 1970 is located above the resonant inductor 122B in lateral direction 880. The first end 1972 may be coupled to a voltage regulator (e.g., the second voltage regulator 1260) located above the resonant inductor 122B in lateral direction 880. The second end 1974 of the supply line 1970 is coupled to the supply input of the second buffer 1450. In this example, the second buffer 1450 may be coupled to ground via the ground line 850B.

The supply line 1970 includes a first portion 1980 and a second portion 1985, in which the first and second portions 1980 and 1985 are orientated approximately perpendicular to each other. The first portion 1980 of the supply line 1970 runs approximately parallel with the first and second elongated portions 740B and 745B of the resonant inductor 122B, and is located between the first and second elongated portions 740B and 745B of the resonant inductor 122B. In the example in FIG. 19C, the first portion 1980 of the supply line 1970 is placed approximately equidistant from the first and second elongated portions 740B and 745B of the resonant inductor 122B.

The second portion 1985 of the supply line 1970 is oriented approximately perpendicular to the first and second elongated portions 740B and 745B of the resonant inductor 122B. The second portion 1985 of the supply line 1970 extends upward from the first portion 1985 of the supply line 1970 in lateral direction 880, and passes over the second elongated portion 745B of the resonant inductor 122B. Thus, the second portion 1985 of the supply line 1970 facilitates supply routing to a voltage regulator (e.g., the second voltage regulator 1260) or another structure located above the resonant inductor 122B in lateral direction 880

Figure 20:
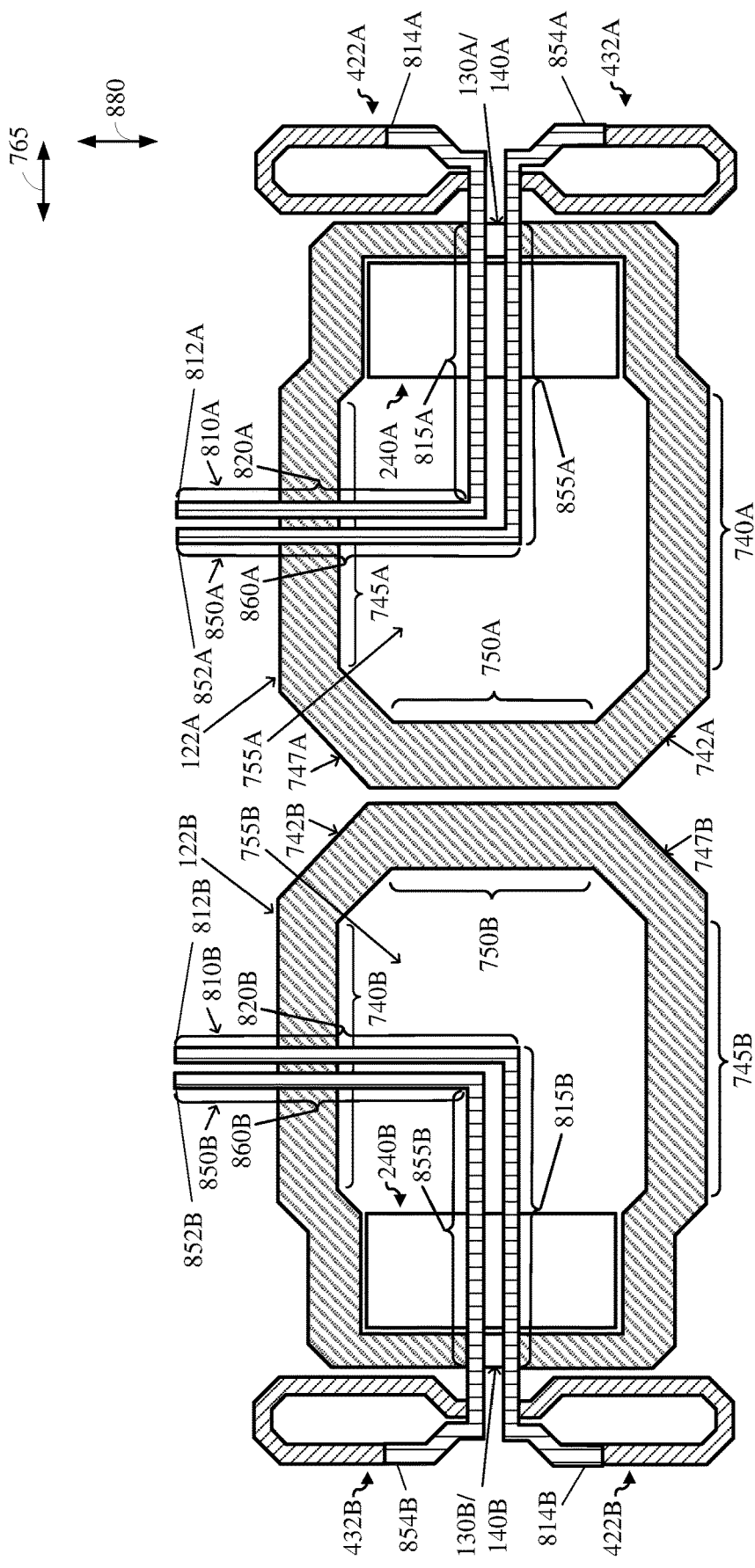
FIG. 20 shows a top view of still another example of a chip layout for a first VCO and a second VCO according to certain aspects of the present disclosure.

FIG. 20 shows an exemplary layout for the first and second VCOs 110A and 110B in which the layout of the second VCO 110B is flipped vertically in direction 880 with respect to the layout of the second VCO 110B shown in FIG. 16.

Figure 21:
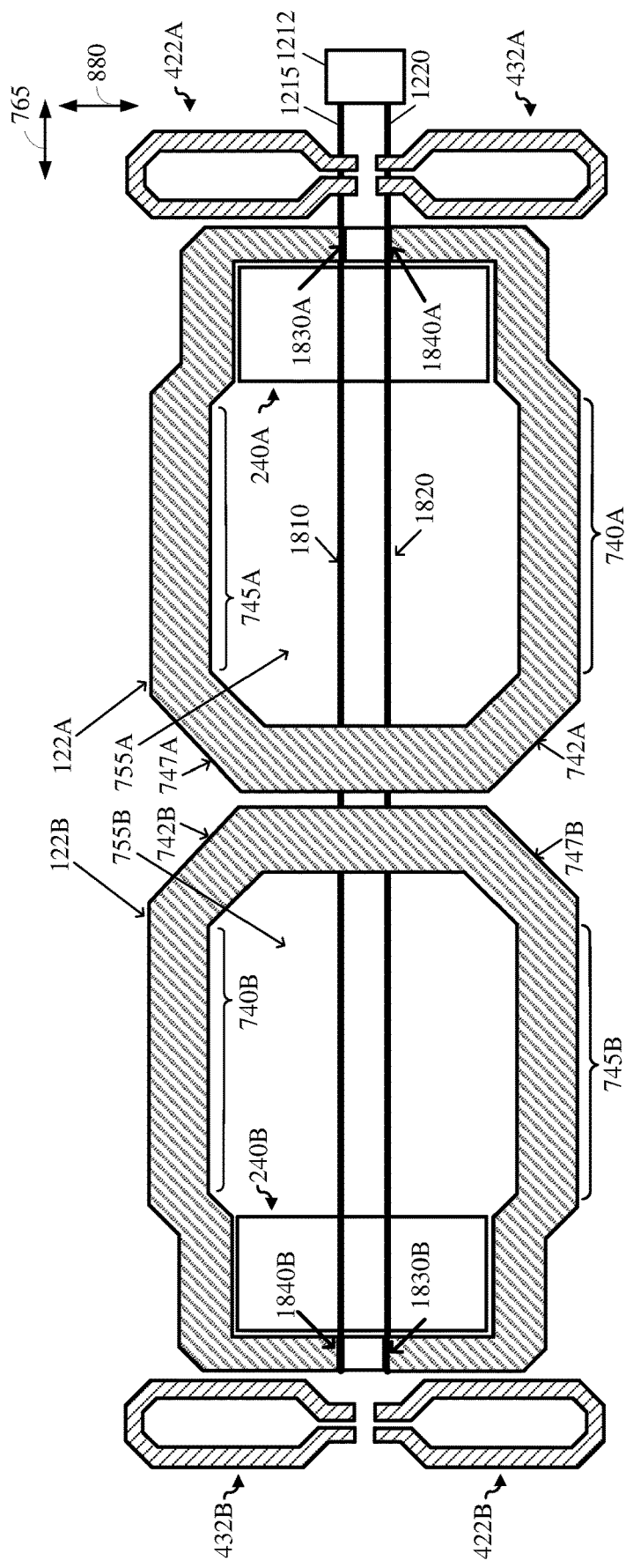
FIG. 21 shows an example of output signal routing for the exemplary layout shown in FIG. 20 according to certain aspects of the present disclosure.

FIG. 21 shows an example of output signal routing for the dual-core VCO 1210 based on the layout shown in FIG. 20. In this example, the first output signal line 1810 is coupled to the first end 1830A of the resonant inductor 122A of the first VCO 110A, which is the same as in FIG. 18A. However, the first output signal line 1810 is coupled to the second end 1840B of the resonant inductor 122A of the second VCO 110B due to the vertical flipping of the resonant inductor 122B. Thus, in this example, the first output signal line 1810 is coupled to the first end 1830A of the resonant inductor 122A of the first VCO 110A and the second end 1840B of the resonant inductor 122B of the second VCO 110B.

In this example, the first output vco_outpA of the first VCO 110A is taken at the first end 1830A of the resonant inductor 122A and the first output vco_outpB of the second VCO 110B is taken at the second end 1840B of the resonant inductor 122B. Thus, in this example, the first output signal line 1810 couples the first output vco_outpA of the first VCO 110A and the first output vco_outpB of the second VCO 110B to the first input 1215 of the buffer 1212.

In this example, the second output signal line 1820 is coupled to the second end 1840A of the resonant inductor 122A of the first VCO 110A, which is the same as in FIG. 18A. However, the second output signal line 1820 is coupled to the first end 1830B of the resonant inductor 122B of the second VCO 110B due to the vertical flipping of the resonant inductor 122B. Thus, in this example, the second output signal line 1820 is coupled to the second end 1840A of the resonant inductor 122A of the first VCO 110A and the first end 1830B of the resonant inductor 122B of the second VCO 110B.

In this example, the second output vco_outnA of the first VCO 110A is taken at the second end 1840A of the resonant inductor 122A and the second output vco_outnB of the second VCO 110B is taken at the first end 1830B of the resonant inductor 122B. Thus, in this example, the second output signal line 1820 couples the second output vco_outnA of the first VCO 110A and the second output vco_outnB of the second VCO 110B to the second input 1220 of the buffer 1212.

The exemplary layout shown in FIG. 21 reduces parasitic differences seen at the output signal lines 1810 and 1820, as discussed further below. The first end 1830A and the second end 1840A of the resonant inductor 122A may see different parasitics (e.g., parasitic inductance, parasitic resistance and/or parasitic capacitance) due to, for example, avoidable geometric differences. Similarly, the first end 1830B and the second end 1840B of the resonant inductor 122B may see different parasitics. The parasitic difference between the first and second ends 1830A and 1840A of the resonant inductor 122A may be approximately the same as the parasitic difference between the first and second ends 1830B and 1840B of the resonant inductor 122B. As a result, coupling the first output signal line 1810 to the first end 1830A of the resonant inductor 122A and the second end 1840B of the resonant inductor 122B and coupling the second output signal line 1820 to the second end 1840A of the resonant inductor 122A and the first end 1830B of the resonant inductor 122B causes the parasitics seen at the first output signal line 1810 to be approximately the same as the parasitics seen at the second output signal line 1820. The reduction in the parasitic differences seen at the output signal lines 1810 and 1820 improves the phase noise of the dual-core VCO 1210.

It is to be appreciated that the terms "first output" and "second output" are used herein as a naming convention to distinguish between two outputs of a VCO. The terms "first output" and "second output" are not tied to particular ends of the resonant inductor of the VCO. Thus, the first output vco_outpB and the second output vco_outnB of the second VCO 110B may be taken from the first end 1830B and the second end 1840B, respectively, of the resonant inductor 122B (as in the example in FIG. 18A) or taken from the second end 1840B and the first end 1830B, respectively, of the resonant inductor 122B (as in the example in FIG. 21). When the outputs of the first and second VCOs 110A and 110B are coupled together, the first and second VCOs 110A and 110B may oscillate at the approximately the same oscillation frequency and phase regardless of whether the output signal lines 1810 and 1820 couple the first and second ends 1830A and 1840A of the resonant inductor 122A to the first and second ends 1830B and 1840B, respectively, of the resonant inductor 122B or the output signal lines 1810 and 1820 couple the first and second ends 1830A and 1840A of the resonant inductor 122A to the second and first ends 1840B and 1830B, respectively, of the resonant inductor 122B.

Figure 22:
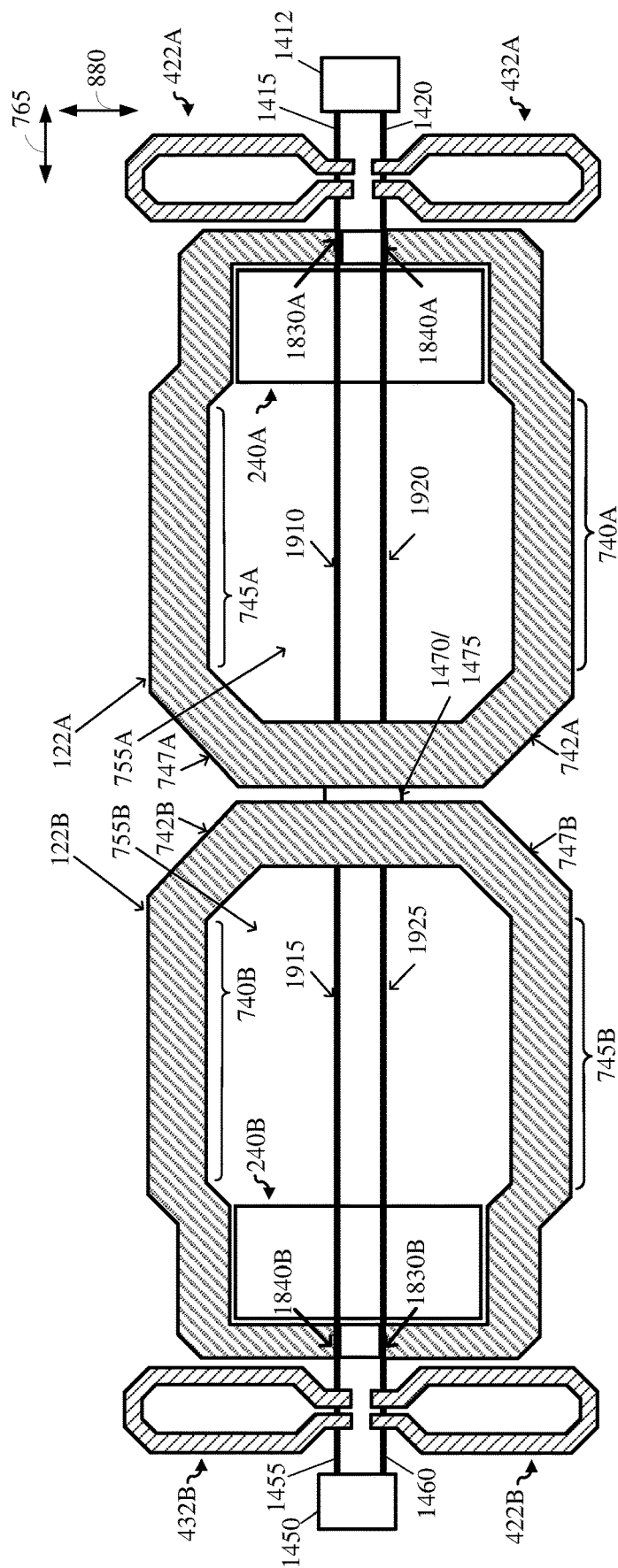
FIG. 22 shows another example of output signal routing for the exemplary layout shown in FIG. 20 according to certain aspects of the present disclosure.

FIG. 22 shows an example of output signal routing for the dual-core VCO 1410 based on the layout shown in FIG. 20. In this example, the output signal routing is similar to the exemplary output signal routing shown in FIGS. 19A and 19B except that the second output signal line 1915 is coupled to the second end 1840B of the resonant inductor 122B and the fourth output signal line 1925 is coupled to the first end 1830B of the resonant inductor 122B due to the vertical flipping of the resonant inductor 122B. In this example, the first output vco_outpB of the second VCO 110B is taken at the second end 1840B of the resonant inductor 122B and the second output vco_outnB of the second VCO 110B is taken at the first end 1830B of the resonant inductor 122B. Other than the above differences, the description of the exemplary output signal routing in FIGS. 19A and 19B applies to the output signal routing shown in FIG. 22, and is therefore not repeated here for brevity.

In this disclosure, a first portion (e.g., first portion 815) of a supply line (e.g., supply line 815) is "approximately equidistant" from first and second elongated portions of a resonant inductor (e.g., resonant inductor 122) when the distance between the first portion of the supply line and the first elongated portion (e.g., first elongated portion 740) is within 80 percent to 120 percent the distance between the first portion of the supply line and the second elongated portion (e.g., second elongated portion 745). Similarly, a first portion (e.g., first portion 855) of a ground line (e.g., ground line 850) is "approximately equidistant" from first and second elongated portions of a resonant inductor (e.g., resonant inductor 122) when the distance between the first portion of the ground line and the first elongated portion (e.g., first elongated portion 740) is within 80 percent to 120 percent the distance between the first portion of the ground line and the second elongated portion (e.g., second elongated portion 745).

In this disclosure, the third elongated portion 750A of the resonant inductor 122A is adjacent to the third elongated portion 750B of the resonant inductor 122B when there is no structure between the third elongated portion 750A of the resonant inductor 122A and the third elongated portion 750B of the resonant inductor 122B formed from the same metal layer as the third elongated portion 750A of the resonant inductor 122A and the third elongated portion 750B of the resonant inductor 122B.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A semiconductor die, comprising:
 a voltage-controlled oscillator (VCO), wherein the VCO includes:
  a resonant capacitor; and
  a resonant inductor coupled in parallel with the resonant capacitor, wherein the resonant inductor includes a first elongated portion and a second elongated portion that are parallel with each other;
 a voltage supply line configured to route a supply voltage to the VCO, wherein the voltage supply line includes a first portion that runs parallel with the first and second elongated portions of the resonant inductor and is located between the first and second elongated portions of the resonant inductor; and
 a ground line configured to couple the VCO to a ground, wherein the ground line includes a first portion that runs parallel with the first and second elongated portions of the resonant inductor and is located between the first and second elongated portions of the resonant inductor.

2. The semiconductor die of claim 1, wherein the first portion of the voltage supply line is approximately equidistant from the first and second elongated portions of the resonant inductor.

3. The semiconductor die of claim 1, wherein the voltage supply line further includes a second portion that is perpendicular to the first and second elongated portions of the resonant inductor.

4. The semiconductor die of claim 3, wherein the second portion of the voltage supply line passes over the first or second elongated portion of the resonant inductor.

5. The semiconductor die of claim 1, wherein the resonant inductor includes a third elongated portion that is perpendicular to both the first and second elongated portions of the resonant inductor.

6. The semiconductor die of claim 5, wherein the first portion of the voltage supply line passes over the third elongated portion of the resonant inductor.

7. The semiconductor die of claim 1, wherein the resonant inductor is formed from a first metal layer, and the voltage supply line is formed from a second metal layer.

8. The semiconductor die of claim 7, wherein the second metal layer is above the first metal layer.

9. The semiconductor die of claim 1, wherein the first portion of the ground line is approximately equidistant from the first and second elongated portions of the resonant inductor.

10. The semiconductor die of claim 1, wherein the ground line further includes a second portion that is perpendicular to the first and second elongated portions of the resonant inductor.

11. The semiconductor die of claim 10, wherein the second portion of the ground line passes over the first or second elongated portion of the resonant inductor.

12. The semiconductor die of claim 1, wherein the VCO further includes:
    an active circuit configured to generate a negative resistance in parallel with the resonant inductor; and
    an impedance inductor coupled between the voltage supply line and the active circuit.

13. The semiconductor die of claim 12, wherein the active circuit is located between the impedance inductor and the first and second elongated portions of the resonant inductor.

14. The semiconductor die of claim 13, wherein the resonant capacitor includes a switchable capacitor bank located between the impedance inductor and the first and second elongated portions of the resonant inductor.

15. The semiconductor die of claim 12, wherein the resonant inductor is formed from a first metal layer, and the impedance inductor is formed from a second metal layer.

16. The semiconductor die of claim 15, wherein the first metal layer is above the second metal layer.

17. The semiconductor die of claim 12, wherein the VCO further includes an impedance capacitor coupled in parallel with the impedance inductor.

18. A semiconductor die, comprising:
    a first voltage-controlled oscillator (VCO), wherein the first VCO includes:
        a first resonant capacitor; and
        a first resonant inductor coupled in parallel with the first resonant capacitor, wherein the first resonant inductor includes a first elongated portion and a second elongated portion that are parallel with each other;
    a first voltage supply line configured to route a supply voltage to the first VCO, wherein the first voltage supply line includes a first portion that runs parallel with the first and second elongated portions of the first resonant inductor and is located between the first and second elongated portions of the first resonant inductor;
    a first ground line configured to couple the first VCO to a ground, wherein the first ground line includes a first portion that runs parallel with the first and second elongated portions of the first resonant inductor and is located between the first and second elongated portions of the first resonant inductor; and
    a second voltage-controlled oscillator (VCO), wherein the second VCO includes:
        a second resonant capacitor; and
        a second resonant inductor coupled in parallel with the second resonant capacitor.

19. The semiconductor die of claim 18, wherein the second resonant inductor includes a first elongated portion and a second elongated portion that are parallel with each other, and the semiconductor die further comprises:
    a second voltage supply line configured to route the supply voltage to the second VCO, wherein the second voltage supply line includes a first portion that runs parallel with the first and second elongated portions of the second resonant inductor and is located between the first and second elongated portions of the second resonant inductor.

20. The semiconductor die of claim 19, wherein:
    the first portion of the first voltage supply line is approximately equidistant from the first and second elongated portions of the first resonant inductor; and
    the first portion of the second voltage supply line is approximately equidistant from the first and second elongated portions of the second resonant inductor.

21. The semiconductor die of claim 20, wherein:
    the first voltage supply line further includes a second portion that is perpendicular to the first and second elongated portions of the first resonant inductor; and
    the second voltage supply line further includes a second portion that is perpendicular to the first and second elongated portions of the second resonant inductor.

22. The semiconductor die of claim 21, wherein:
    the second portion of the first voltage supply line passes over the first or second elongated portion of the first resonant inductor; and
    the second portion of the second voltage supply line passes over the first or second elongated portion of the second resonant inductor.

23. The semiconductor die of claim 19, wherein:
    the first resonant inductor includes a third elongated portion that is perpendicular to both the first and second elongated portions of the first resonant inductor;
    the second resonant inductor includes a third elongated portion that is perpendicular to both the first and second elongated portions of the second resonant inductor; and
    the third elongated portion of the first resonant inductor is parallel with the third elongated portion of the second resonant inductor.

24. The semiconductor die of claim 23, wherein third elongated portion of the first resonant inductor is adjacent to the third elongated portion of the second resonant inductor.

25. The semiconductor die of claim 18, further comprising:
    a first output signal line coupled to a first output of the first VCO and a first output of the second VCO;

a second output signal line coupled to a second output of the first VCO and a second output of the second VCO; and a buffer including a first input, a second input, and an output, wherein the first input is coupled to the first output signal line, and the second input is coupled to the second output signal.

26. The semiconductor die of claim 18, further comprising:

a first output signal line coupled to a first output of the first VCO;

a second output signal line coupled to a first output of the second VCO; and a first switch coupled between the first output signal line and the second output signal line.

27. The semiconductor die of claim 26, further comprising:

a third output signal line coupled to a second output of the first VCO;

a fourth output signal line coupled to a second output of the second VCO; and a second switch coupled between the third output signal line and the fourth output signal line.

28. The semiconductor die of claim 27, further comprising:

a first buffer including a first input, a second input, and an output, wherein the first input of the first buffer is coupled to the first output signal line, and the second input of the first buffer is coupled to the third output signal line; and a second buffer including a first input, a second input, and an output, wherein the first input of the second buffer is coupled to the second output signal line, and the second input of the second buffer is coupled to the fourth output signal line.

29. The semiconductor die of claim 28, further comprising a local oscillator (LO) generator coupled to the output of the first buffer.

30. The semiconductor die of claim 29, further comprising a frequency divider coupled to the output of the second buffer.

31. The semiconductor die of claim 30, wherein:

the first resonant capacitor comprises a first varactor;

the second resonant capacitor comprises a second varactor;

the frequency divider is in a feedback loop of a phase-locked loop (PLL), wherein the PLL controls a tuning voltage input to the first and second varactors.

* * * * *